United States Patent [19]

Ito et al.

[11] Patent Number: 5,348,558

[45] Date of Patent: Sep. 20, 1994

[54] LAYOUT PATTERN GENERATING APPARATUS

[75] Inventors: Yoshihiro Ito; Hideyuki Fukaya, both of Hyogo, Japan

[73] Assignee: Mitsubishi Denki Kabushiki Kaisha, Tokyo, Japan

[21] Appl. No.: 46,610

[22] Filed: Apr. 12, 1993

[30] Foreign Application Priority Data

Apr. 23, 1992 [JP] Japan ................... 4-130173

[51] Int. Cl.⁵ .............................. G06F 15/00
[52] U.S. Cl. ........................ 29/25.01; 437/48; 437/51; 437/250; 364/490; 364/491
[58] Field of Search ........... 364/490, 491; 437/48, 437/51, 52, 250; 29/25.01

[56] References Cited

U.S. PATENT DOCUMENTS

| | | |
|---|---|---|
| 4,528,634 | 7/1985 | Nakhata et al. ............ 364/491 |
| 4,718,017 | 1/1988 | Hutton et al. ............. 364/491 |
| 4,839,821 | 6/1989 | Murakata .................. 364/491 |

*Primary Examiner*—Tom Thomas
*Attorney, Agent, or Firm*—Townsend and Townsend Khourie and Crew

[57] ABSTRACT

In a layout pattern generating apparatus, a truth value data grouping section 3 groups truth value data whose logic is "1" and which are adjacent to each other, and a coordinate value data calculating section 4 calculates coordinate data on a layout pattern at every grouped truth value data, thereby producing a layout pattern.

4 Claims, 29 Drawing Sheets

|   |   |   |   |   |   |   |
|---|---|---|---|---|---|---|
| 0 | 1 | 1 | 1 | 1 | 0 | 0 |
| 0 | 1 | 0 | 0 | 1 | 1 | 0 |
| 1 | 1 | 1 | 1 | 1 | 1 | 1 |
| 0 | 0 | 0 | 0 | 0 | 1 | 1 |
| 0 | 1 | 0 | 1 | 1 | 0 | 0 |
| 1 | 1 | 0 | 0 | 1 | 1 | 1 |

SHOWING RECTANGLE

LAYOUT PATTERN GENERATING APPARATUS

BACKGROUND OF THE INVENTION

1. Field of the Invention

The present invention relates to a layout pattern generating apparatus for generating a layout pattern to be used for writing ROM data in an LSI including a mask ROM.

2. Description of the Prior Art

Generally, for writing the logic "1" in manufacturing a ROM, a mask for exposure is first required to be manufactured which is necessary for the writing of the logic "1", and for manufacturing this mask, a layout pattern generating apparatus is required which calculates and outputs coordinate values for the manufacture of the mask on the basis of the truth value data. That is, as shown in FIG. 5, in the case of successively retrieving whether or not the logic "1" exists at the right side of truth value data f whose logic is "1", when a decision is made such that the truth value data whose logic is "1" exists at the right side of the truth value data of the logic "1", the starting point f1 to the lower right-end set point f2 are not read but all of 5 points including the lower left-end set point g1 of the data g, the upper left-end set point g4, the upper left-end set point f4 and the starting point f1 are read so as to set an area M to take in the gap N between the data f and the data g. Thereafter, the respective points g1, g2, g3, g4 and g1 of the next data g are read to set an area P. According to this operation, unlike the operation which independently reads a rectangular area corresponding to the data f, a rectangular area corresponding to the gap N and a rectangular area corresponding to the data g, the gap N can be read together with the data f, thus making easy the operation.

FIG. 20 is an input/output-related illustration for describing the conventional layout pattern generating apparatus in detail. In FIG. 20, numeral 201 designates a truth value data to be inputted to this apparatus, 206 represents a corrected layout pattern to be outputted from this apparatus and 207 denotes a ROM layout pattern correcting apparatus which acts as the layout pattern generating apparatus.

FIG. 21 is a functional block diagram showing the conventional layout pattern generating apparatus. In FIG. 21, numeral 202 designates a truth value data reading means for reading the truth value data 201, 213 represents a coordinate data calculating means for calculating coordinate data of the layout pattern corresponding to the truth value data 201, 214 denotes a layout pattern correcting means for correcting the layout pattern to produce the corrected layout pattern 206, and 215 depicts a coordinate data storing section for storing the coordinate data calculated in the coordinate data calculating means 213.

FIG. 22 shows one example of the truth data, and FIG. 23 illustrates one example of the layout pattern where the layout pattern coordinate is calculated only with respect to the truth value data whose logic is "1". Further, FIG. 24 shows one example of the corrected layout pattern after the correction of the layout pattern, and FIG. 25 is a flow chart showing the operation of the conventional layout pattern generating apparatus.

Secondly, the operation of the conventional apparatus will be described hereinbelow with reference to FIGS. 20 to 25. First, the truth value data are read by the truth value data reading means 202 (step N1). The truth value data means the ROM data converted into the binary number data, comprising the logic "1" and the logic "0", and rearranged to correspond to a memory cell array on the layout pattern. A rectangular coordinate data to be drawn on the mask ROM with respect to the logic "1" truth value data are calculated by the coordinate data calculating means 213 to produce the layout pattern (step N2). Then, the layout pattern correcting means 214 retrieves, with respect to the respective rectangles of the layout pattern, whether a rectangle adjacent to the upper, lower and right, left positions exists (step N3). If there is the rectangle adjacent thereto, the layout pattern correcting means 214 performs the correction of the layout pattern to produce the corrected layout pattern (step N4). There is no rectangle adjacent thereto, the correction of the layout pattern is not effected. Here, the correction of the layout pattern means that the rectangular coordinate data is recalculated so as to eliminate the gap between the adjoining rectangles (FIG. 24).

FIG. 26 is a functional block diagram showing the conventional layout pattern. In FIG. 26, numeral 1 represents truth value data to be inputted to this layout pattern generating apparatus, 4 designates coordinate value data, 12 denotes a corrected layout pattern data to be outputted from this apparatus, 124 depicts a reading means for reading the truth value data 1, 125 indicates a truth value data retrieving means for retrieving whether an adjoining rectangle exists around the rectangle (the truth value data ="1"), and 126 is a layout pattern producing means for performing the correction of the layout pattern to produce the layout pattern data.

FIG. 27 shows one example of the truth value data. FIG. 28 shows one example of the layout pattern after the layout pattern process. In FIG. 28, 15a represents a light-transmission pattern and 15b designates a light-cutting pattern. A printing is effected with respect to a device in accordance with these patterns.

FIGS. 29(a) and (b) flow charts showing the operation of the conventional layout pattern generating apparatus. In FIGS. 29(a) and (b), the truth value data is first read (step 127). The truth value data means the ROM data (hexadecimal number) which is inputted to the LSI with the mask ROM, the ROM data being converted into binary number data, comprising "1" and "0", and rearranged to correspond to the memory cell array on the layout pattern. Here, when the truth value data have ended, the process terminates (step 128). It is checked whether or not the read truth value data is the data for generating a rectangle (step 129). If the truth value data is the rectangle-generating data (truth value data ="1"), the coordinate value data calculating process is effected for performing the correction process of the layout pattern data. If it is the data (truth value data="0") which does not generate the rectangle, the operational flow returns to the truth value data reading process.

Further, it is effected to retrieve whether a rectangle (truth value data="1") adjacent to the upper, right and upper-right sides of the rectangle-generating data exists (step 130). If there is the rectangle adjacent to all of the upper, right-upper and right sides thereof, the correction process of the layout pattern is performed so as to fill up the gaps between the rectangles existing at the upper, right-upper and right sides thereof (step 131), thereby producing the corrected layout pattern. If there is no rectangle which is adjacent to at least one of the upper, right-upper and right sides thereof, the next retrieving process is effected. Here, the layout pattern correcting process means that the rectangular coordinate value data is calculated so as to fill up the gap between the adjacent rectangles (FIG. 28).

Moreover, it is effected to retrieve whether a rectangle adjacent to the right side of the data which generates a rectangle exists (step 132). If there is the rectangle adjacent to the right side thereof, the correction process of the layout pattern is effected so as to fill up the gap between the rectangles (step 133), thereby produce the corrected layout pattern 12. If such rectangles do not exist at the right side, the next retrieving process is effected. Further, it is checked whether or not a rectangle adjacent to the lower and lower-right sides of the data which generates a rectangle exists (step 134). If the rectangle adjacent to all of the lower and lower-right sides thereof exists, it is checked whether or not a rectangle adjacent to the upper side thereof exists (step 135). Here, if there is the rectangle adjacent to the upper side thereof exists, the correction process of the layout pattern is effected so as to fill up the gap between the upper and lower side rectangles (step 136). If the rectangle adjacent to the upper side thereof does not exist, the correction process of the layout pattern is effected so as to fill up the gap relative to the lower side rectangle (step 137), thereby to produce the corrected layout pattern. If the rectangle adjacent to at least one of the lower and lower-right sides thereof does not exist, the next retrieving process is effected.

Still further, it is checked whether or not a rectangle adjacent to the upper side of the data which generates a rectangle exists (step 138). If the rectangle adjacent to the upper side thereof exists, the correction process of the layout pattern is effected to fill up the gap relative to the upper side rectangle (step 139) so as to produce the corrected layout pattern. If the rectangle adjacent to the upper side thereof does not exist, the operation advances to the next process.

If a rectangle adjacent to the upper, right, upper-right, lower-right and lower sides thereof does not exists, the layout pattern is produced without performing the correction process of the layout pattern (step 140).

The above-described operation for retrieving the adjoining rectangles and for calculating the rectangular coordinate value data is repeatedly effected with respect to each truth value data up to the end of the truth value data, Since the conventional layout pattern generating apparatus is arranged as being described above, even if taking in the gap N between the adjacent data f and g where the logic is "1", in terms of the layout pattern the coordinate data is produced one by one in correspondence with the truth value data whose logic is "1". That is, similarly, the process is required to be effected to produce the coordinate data with respect to the respective data f and g. In the case of the mask ROM LSI having an extremely large ROM capacity, if the coordinate data is produced one by one with respect to the truth value data whose logic is "1", there is a problem that the data amount of the layout pattern extremely becomes large to require a large disc capacity for the processing, that is, the disc capacity for the processing lacks, and the time necessary for the processing becomes long.

SUMMARY OF THE INVENTION

The present invention has been developed in order to remove the aforementioned problem, and it is therefore an object to provide a layout pattern generating apparatus which is capable of reducing the data amount of the layout pattern with the layout pattern being produced by polygons taking into account the correction process at the time of the production of the layout pattern (considering the process in which the corrected rectangles are combined with each other to form one pattern), that is, the rectangular area formed by the combination of the data f and g whose logic are "1" being read as the points f1, g2, g3, f4 and f1.

A layout pattern generating apparatus according to this invention, being defined in the claim 1, comprises truth value data reading means 202 for reading truth value data of the logic "1" or "0" in which the ROM data is rearranged so as to correspond to a memory cell array on a layout pattern, truth value data grouping means 203 for grouping the truth value data having the same value and adjacent to each other, and coordinate value data calculating means 204 for calculating coordinate value data on the layout pattern at every grouped truth value data to produce a layout pattern.

A layout pattern generating apparatus according to the invention, defined in the claim 2, comprises truth value data reading means 2 for reading truth value data of the logic "1" where the ROM data is rearranged so as to correspond to a memory cell array on a memory pattern, truth value data grouping means for successively checking whether data of the logic "1" exists in the upper side direction, lower side direction, left side direction or right side direction of the truth data of the logic "1" so as to, if existing, group (put) it into the same group (group together both the truth data), coordinate value data calculating means 5 for calculating a coordinate value of a layout pattern to be drawn on a mask, and layout pattern producing means 7 including circumferential coordinate value data extracting means 8 to determine the outer circumference of the entire grouped truth value data of the logic "1".

In a layout pattern generating apparatus according to the invention, defined in the claim 3, the correction process of the layout pattern is effected so that the data grouping is made only in the longitudinal directions or the transverse directions.

In a layout pattern generating apparatus according to the invention, defined in the claim 4, the layout pattern producing means 7 is equipped with inside-selection data retrieving means 9 for deciding whether data of the logic "0" exists in the entire truth value data of the logic "1" grouped by the truth value data grouping means 3, so that, if the inside-selection data retrieving means 9 decides the existence of the data of the logic "0", the truth value data grouping means 3 successively decides whether data of the logic "0" exists in the upper side direction, lower side direction, left side direction and right side direction of the data of the logic "0", and the layout pattern producing means 7 is further equipped with inside-selection coordinate value data extracting means 10 for, when truth value data grouping means 3 decides the existence of the data of the logic "0", grouping the logic "0" data as the same group so as to determine the outer circumference of the entire grouped logic "0" truth value data.

According to the invention defined in the claim 1, the truth value data of the logic "1" or "0" adjacent to each other are grouped so as to calculate the coordinate value data at every grouped truth value data, thereby reducing the data amount of the layout pattern.

According to the invention defined in the claim 2, the truth value data of the logic "1" adjacent to each other are grouped so as to calculate the coordinate value data at every grouped truth value data, thus reducing the data amount of the layout pattern.

According to the invention defined in the claim 3, in the correction process of the layout pattern, the grouping of the data of the logic "1" or "0" is effected only in the longitudinal and transverse directions, thus reducing the data amount of the layout pattern.

According to the invention defined in the claim 4, when the data of the logic "0" exists in the entire grouped truth value data of the logic "1", the data of the logic "0" are grouped into the same group so as to determine the outer circumference of the entire grouped logic "0" truth value data, thus reducing the data amount of the layout pattern.

The above and other objects, features, and advantages of the Invention will become more apparent from the following description when taken in conjunction with the accompanying drawings.

DESCRIPTION OF THE PREFERRED EMBODIMENT

Embodiment 1

Figure 1:
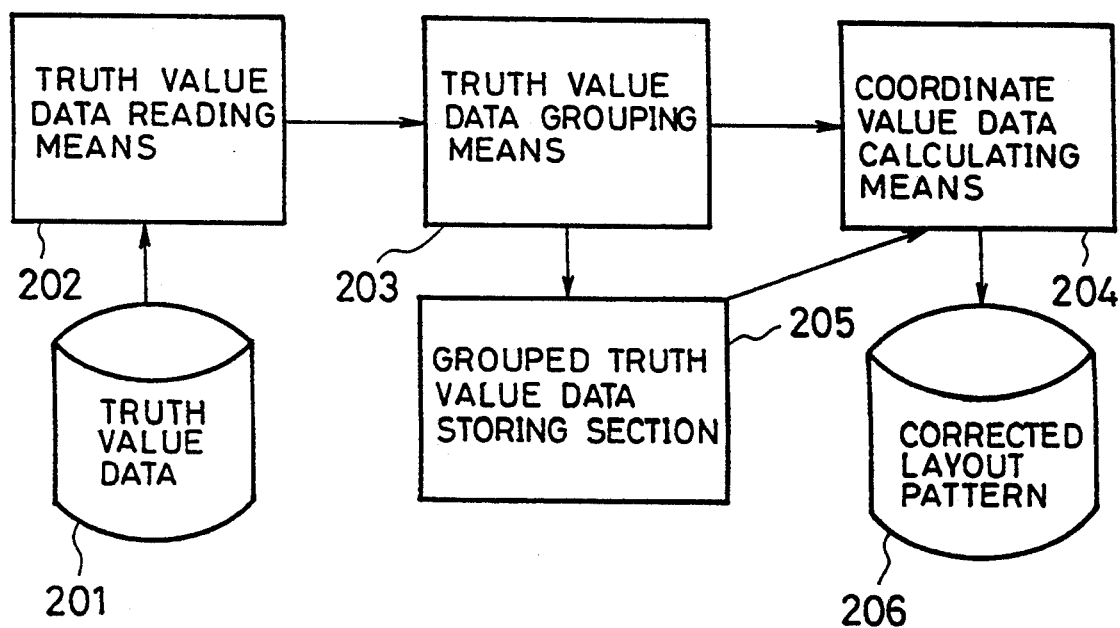
FIG. 1 is a functional block diagram showing a layout pattern generating apparatus according to an embodiment of the invention defined in the claim I.
Figure 2:
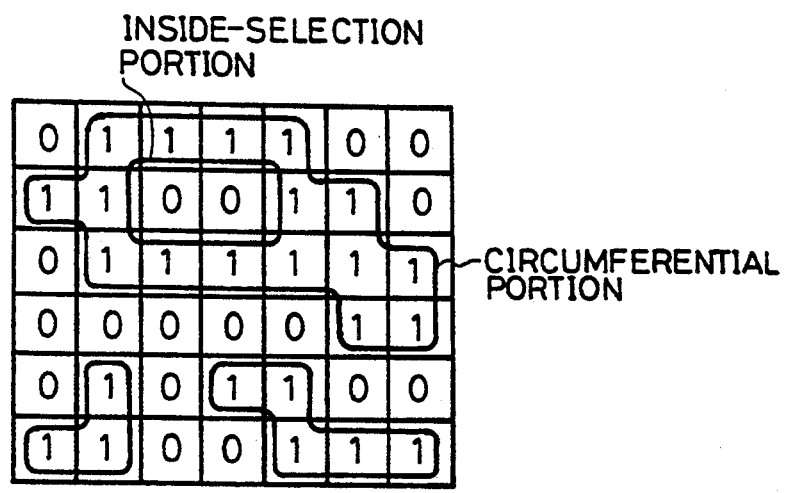
FIG. 2 shows one example of truth value data grouped by the FIG. 1 layout pattern generating apparatus.
Figure 3:
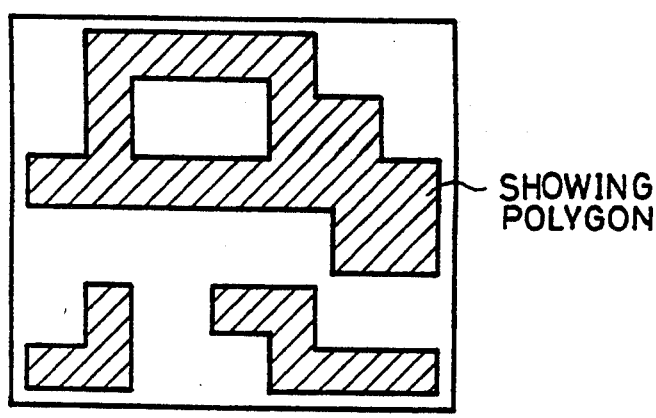
FIG. 3 shows one example of a layout pattern corrected by the FIG. 1 layout pattern generating apparatus.
Figure 4:
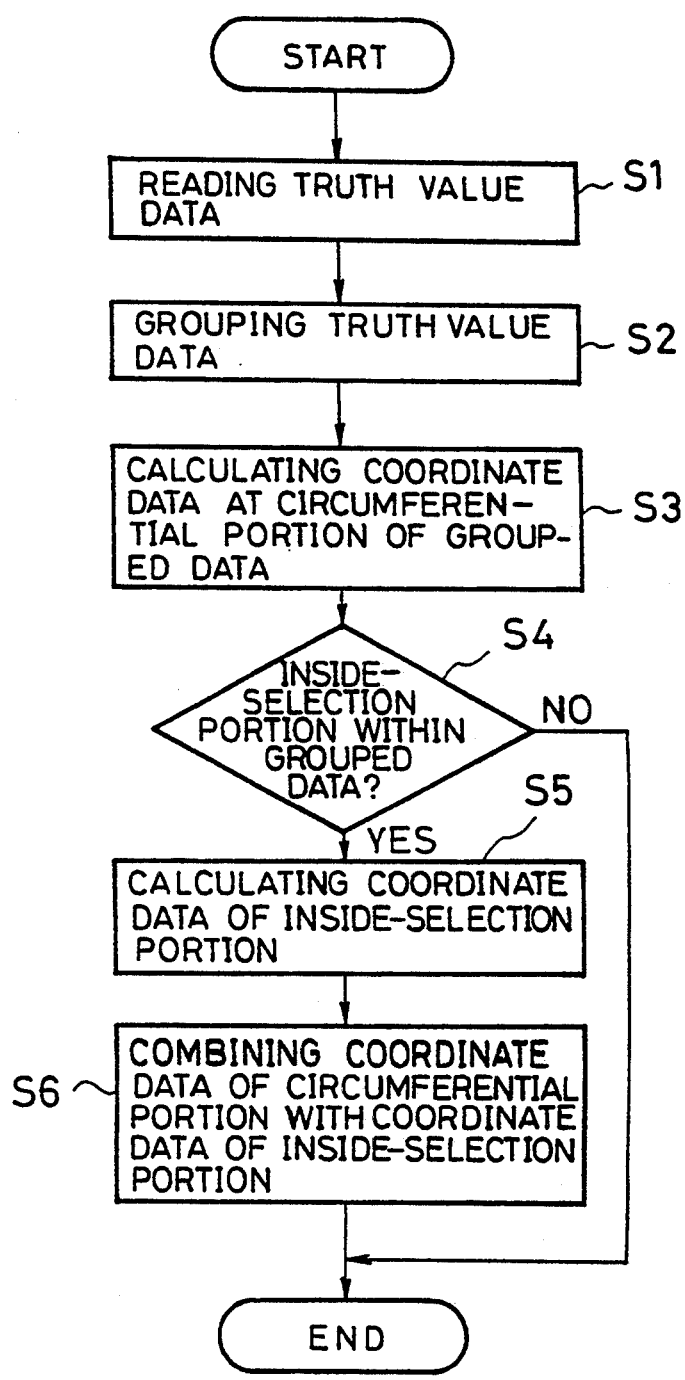
FIG. 4 is a flow chart showing an operation of the FIG. 1 layout pattern generating apparatus.
Figure 5:
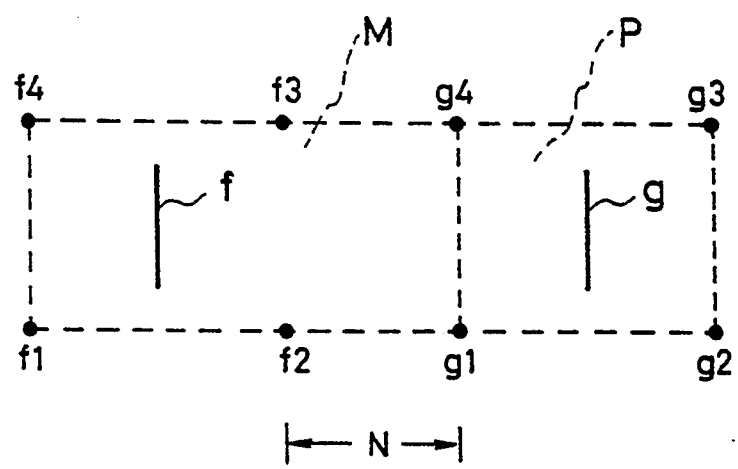
FIG. 5 is an illustration for describing a process to retrieve truth value data.
Figure 19:
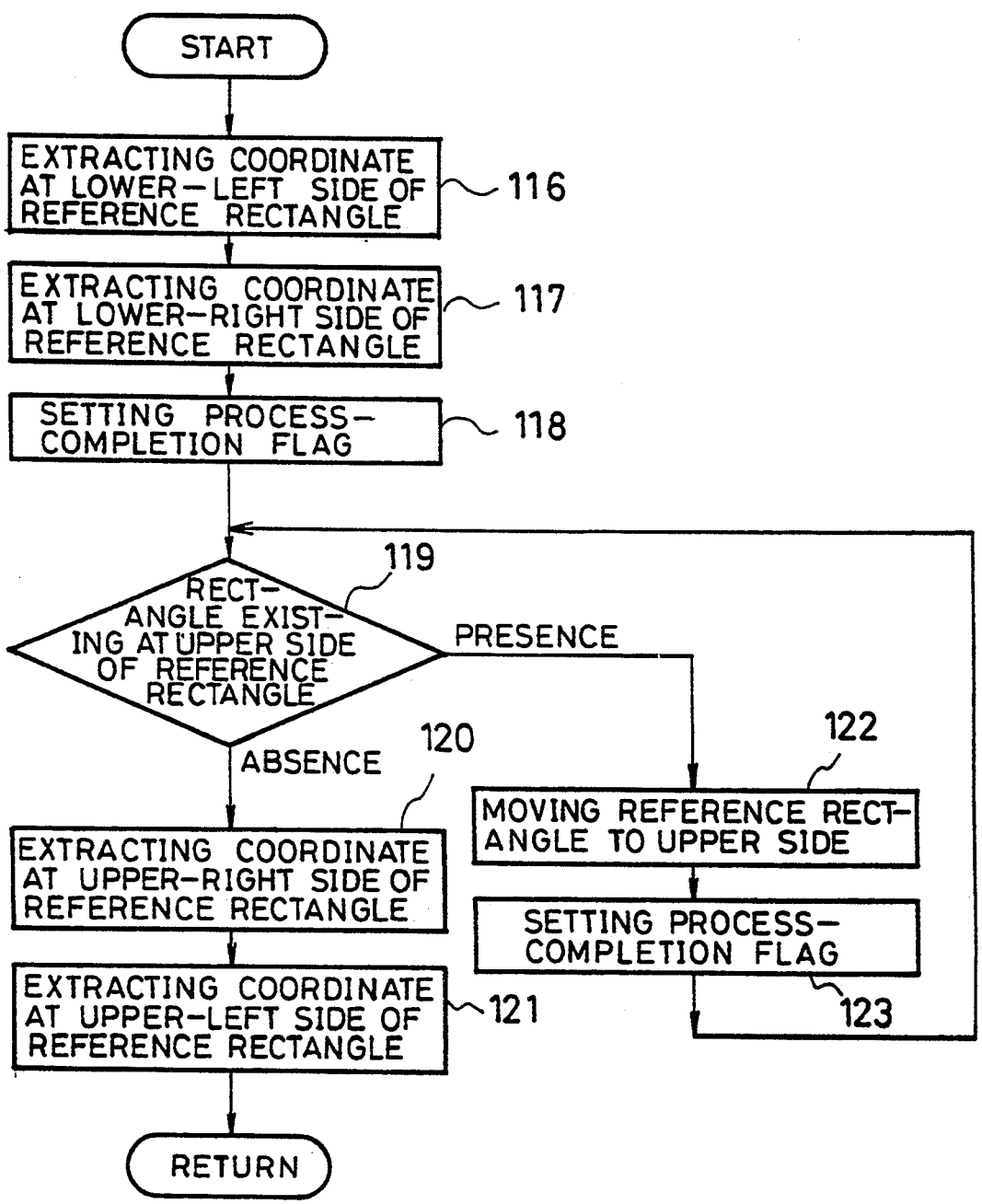
FIG. 19 is a flow chart showing an operation for a layout pattern correcting process to perform the layout pattern correcting process only in the longitudinal direction.
Figure 20:
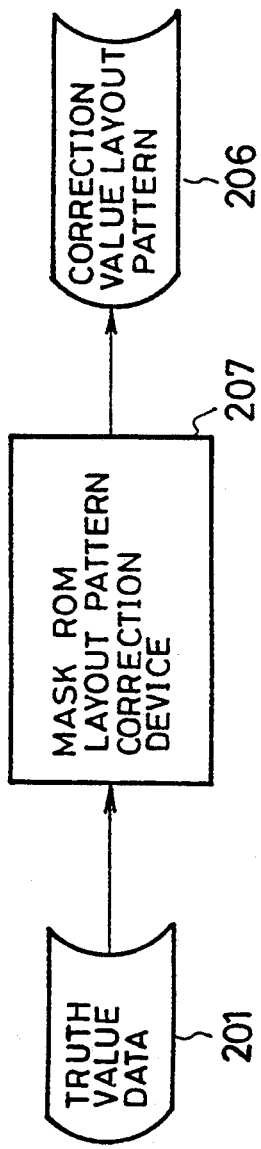
FIG. 20 is a block diagram showing an input/output relation in a conventional layout pattern generating apparatus.
Figure 21:
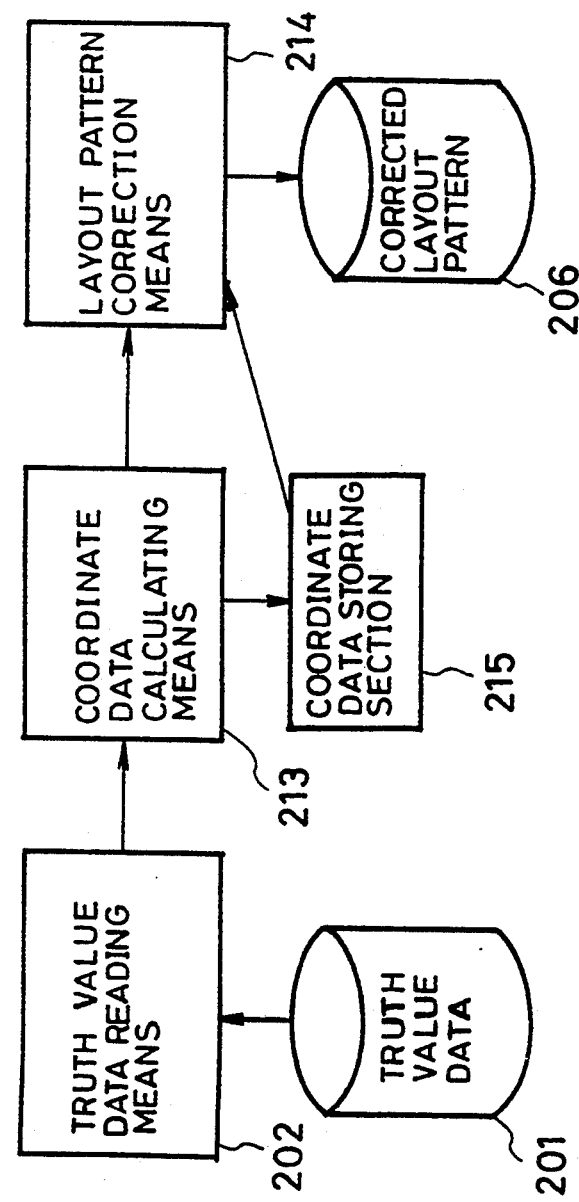
FIG. 21 is a functional block diagram showing a conventional layout pattern generating apparatus.
Figures 22, 23:
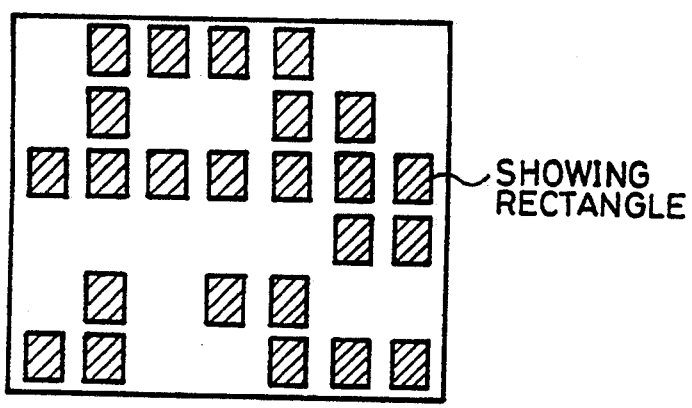
FIG. 22 shows one example of truth value data to be inputted to a layout pattern generating apparatus.
FIG. 23 illustrates one example of a layout pattern due to a conventional layout pattern generating apparatus.
Figure 24:
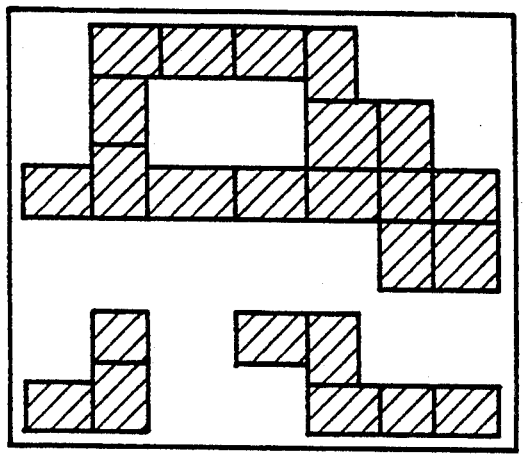
FIG. 24 shows one example of a corrected layout pattern due to a conventional layout pattern generating apparatus.
Figure 25:
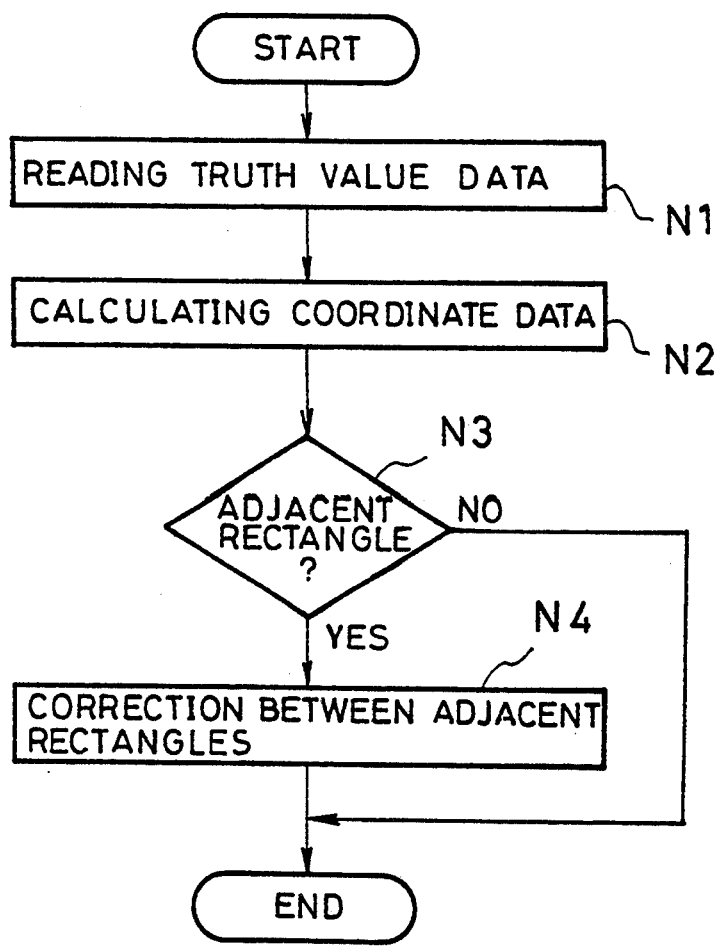
FIG. 25 is a flow chart showing an operation of a conventional layout pattern generating apparatus.
Figure 26:
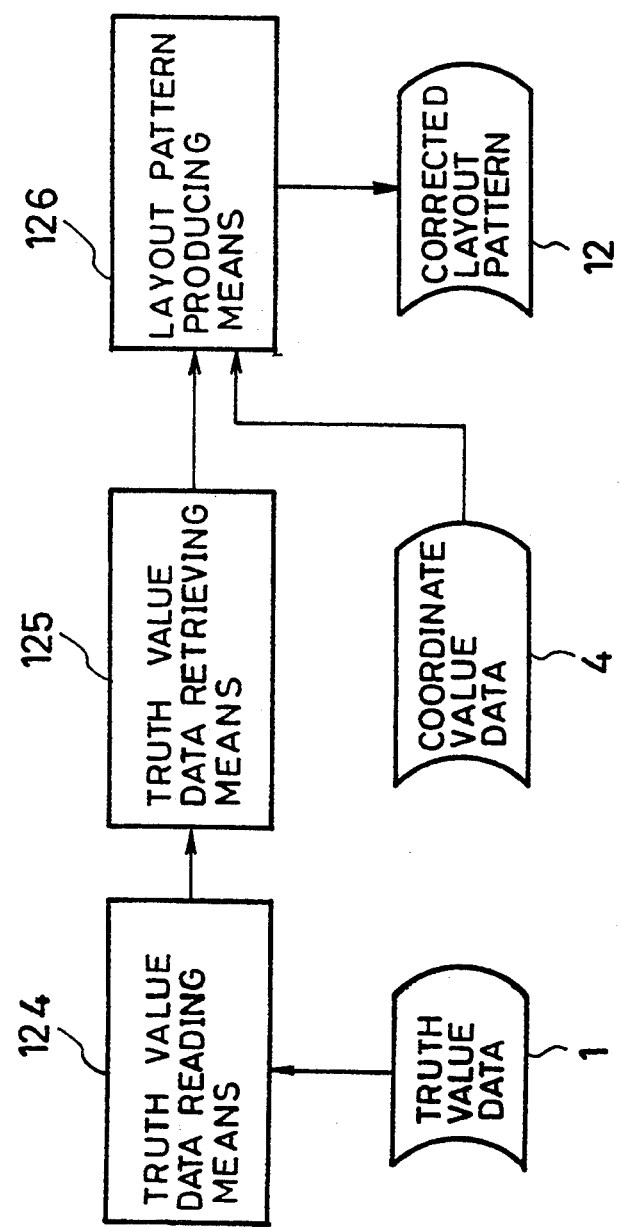
FIG. 26 is a functional block diagram showing a conventional layout pattern generating apparatus.
Figure 27:
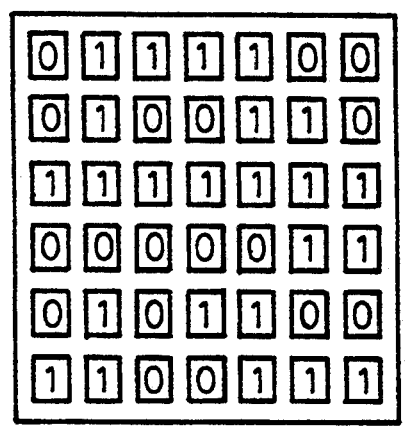
FIG. 27 shows one example of truth value data to be inputted to a layout pattern generating apparatus.
Figure 28:
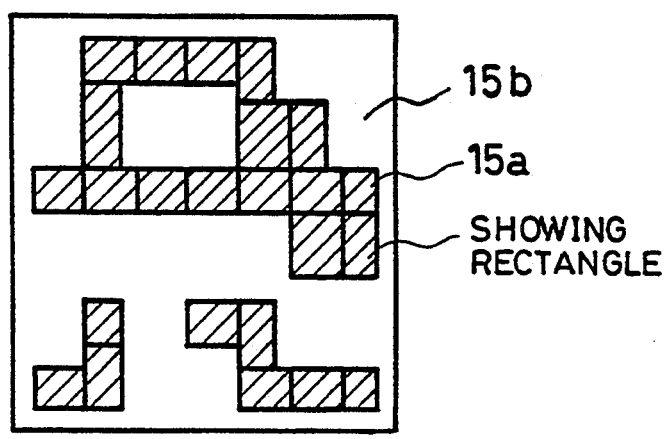
FIG. 28 is an illustration of one example of a layout pattern after a process effected by a conventional layout pattern generating apparatus.
Figure 29A:
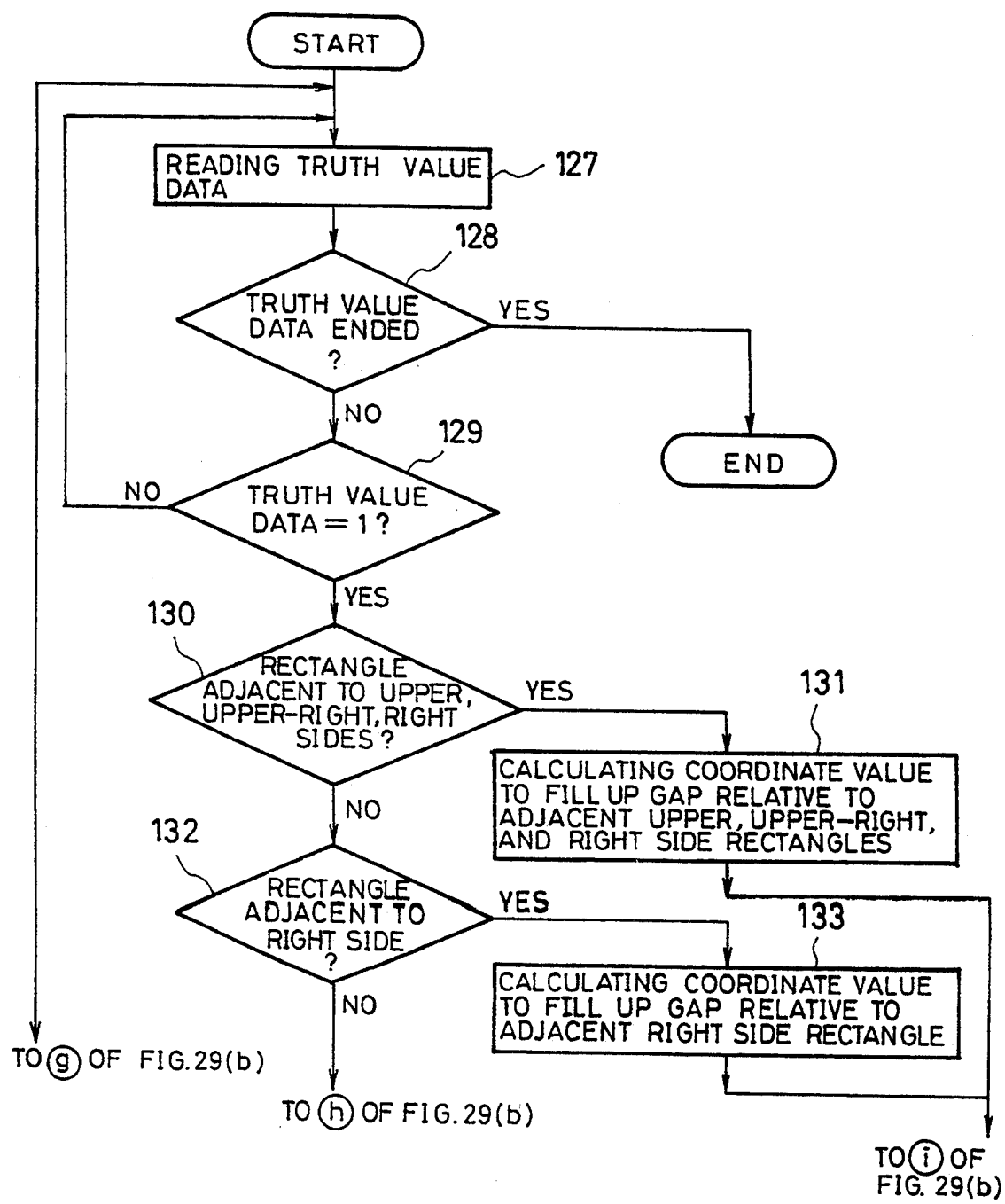
FIGS. 29(a) and (b) is a flow chart showing an operation of a conventional layout pattern generating apparatus.
Figure 29B:
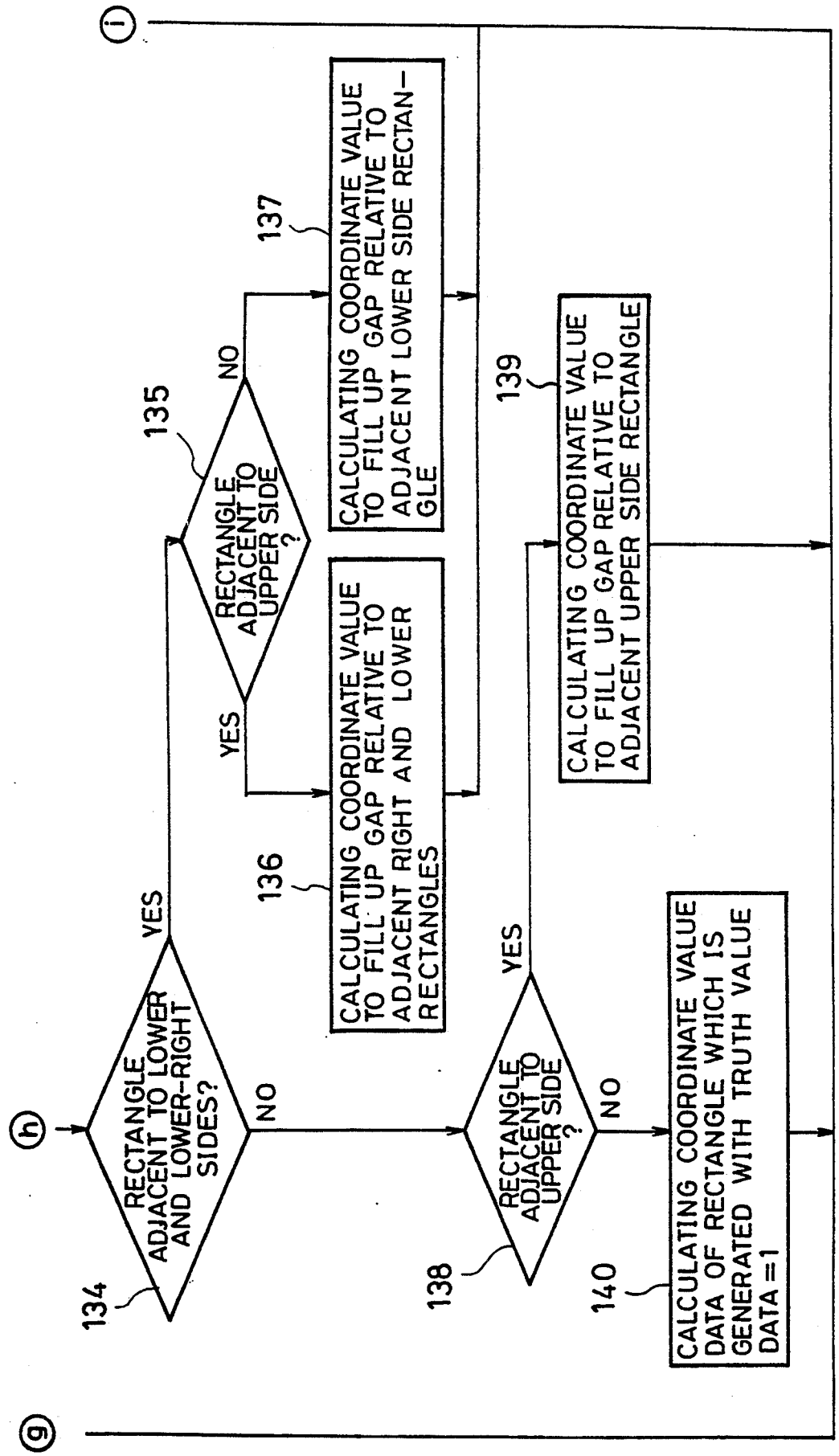

FIG. 1 is a functional block diagram showing a layout pattern generating apparatus according to an embodiment of the invention defined in the claim 1. Parts in FIG. 1 corresponding to components shown in FIG. 19 are indicated by the same marks and the description thereof will be omitted. In FIG. 1, numeral 203 represents a truth value data grouping means for grouping truth value data of the logic "1" adjacent to each other so as to produce grouped truth value data, 204 designates a coordinate data calculating means for calculating coordinate data at every grouped truth value data to produce corrected layout pattern data, and 205 denotes grouped truth value data storing means for storing the truth valve data grouped by the truth valve data grouping means 203. FIG. 2 shows an example of the grouped truth value data, FIG. 3 shows a corrected layout pattern to obtained by calculating the coordinate value at every grouped truth valve data, and FIG. 4 is a flow chart showing an operation of this embodiment.

The operation of this embodiment will be described hereinbelow with reference to FIGS. 1 to 4. First, truth value data reading means 202 reads the truth value data (step S1) as well as in the conventional apparatus. Secondly, the truth value data grouping means 203 groups the truth value data of the logic "1" adjacent to each other (step S2). That is, the truth value data grouping means 203 successively decides whether data of the logic "1" exist in the upper side direction, lower side direction, left side direction or right side direction of the truth value data of the logic "1" and, if the data of the logic "1" exist, group them as the same group. The outermost (outer circumferential) truth value data of the grouped truth value data are combined with each other and the coordinate data on the layout pattern are calculated by the coordinate data calculating means 204, thereby produce a corrected layout pattern with a polygonal configuration which takes into account the correction (step S3). Further, it is checked whether a truth value data portion of the logic "0" (inside-selection portion) exists in the grouped truth value data of the logic "1" (step S4). If there is the inside-selection portion, the coordinate data of the inside-selection portion is calculated by the coordinate data calculating means 204 (step S5) and combined with the coordinate data of the outer circumferential portion calculated in the step S3 (step S6), thus reproducing the corrected layout pattern. If there is no inside-selection portion, the process for the inside-selection portion process is not effected.

Embodiment 2

Figure 6:
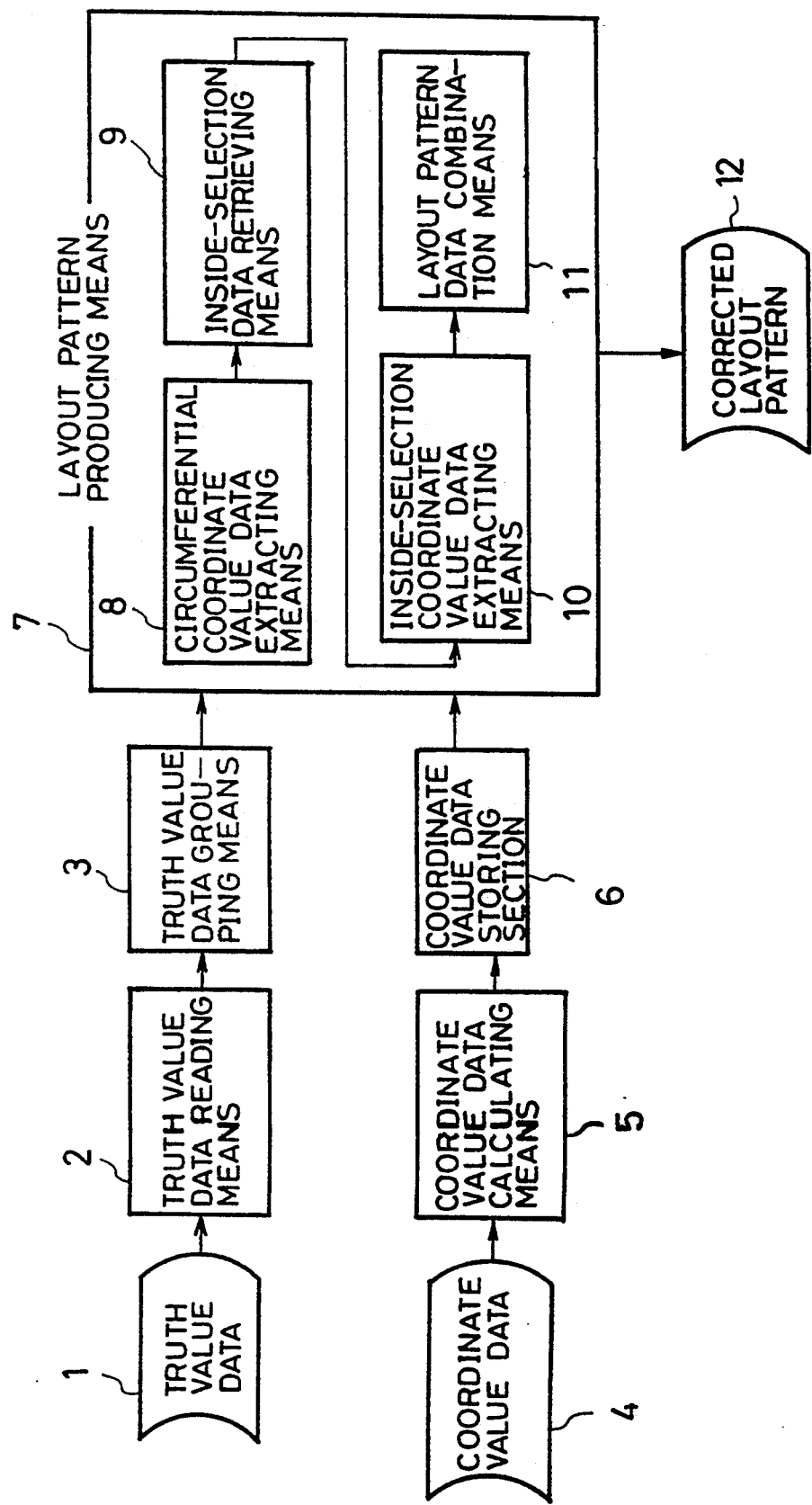
FIG. 6 is a functional block diagram showing a layout pattern generating apparatus according to an embodiment of the invention defined in the claims 2 and 4.

FIG. 6 is a functional block diagram showing a layout pattern generating apparatus according to an embodiment of the invention defined in the claims 2 and 4. In FIG. 6, numeral 1 represents truth value value which is an input of this layout pattern generating apparatus, 2 designates a truth value data reading means for reading truth value data of the logic "1" in which ROM data are rearranged to correspond to a memory cell array on a layout pattern, 3 denotes a truth value data grouping means for grouping data (truth value data="1") which generate a rectangle and which are adjacent to each other, i.e., for successively deciding whether data of the logic "1" exist in the upper side direction, lower side direction, left side direction or right side direction of the truth value data of the logic "1" so as to, if the logic "1" data exist, group them as the same group, 4 represents coordinate value data for storing information used for calculating a coordinate value, 5 denotes a coordinate value data calculating means for calculating the coordinate value of the layout pattern to be drawn on a mask, 6 indicates a coordinate value data storing section for storing the calculated coordinate value data on a memory, and 7 is a layout pattern producing means for producing layout pattern data (polygon) on the basis of the grouped truth value data while taking into account a correction process of the layout pattern. In the layout pattern producing means 7, numeral 8 represents a circumferential coordinate value data extracting means for extracting the summit coordinate of the outer circumferential portion of the grouped truth value data from the coordinate value data storing section 6, i.e., for determining the outer circumference of the entire grouped logic "1" truth value data, 9 denotes an inside-selection data retrieving means for retrieving whether or not data (truth value data="0") which does not generate a rectangle exists in the grouped truth value data, and 10 depicts an inside-selection coordinate value data extracting means for extracting the coordinate value of the inside-selection data, retrieved by the inside-selection retrieving means 9, from the coordinate value data storing means 6, i.e., for, when the inside-selection data retrieving means 9 decides that the data of the logic "0" exists, successively decides, through the truth value data grouping means 3, whether or not data of the logic "0" exist in the upper side direction, lower side direction, left side direction or right side direction of the truth value data of the logic "0" so as to, if the data of the logic "0" exist, group the data as the same group to determine the outer circumference of the entire grouped logic "0" truth value data. Further, numeral 11 indicates layout pattern data combination means for combining the layout pattern data produced by the circumferential coordinate value data extracting means indicative of the detailed means for the layout pattern production with the layout pattern data produced by the inside-selection coordinate value data extracting means so as to produce one layout pattern data, and 12 denotes a corrected layout pattern which is an output of the layout pattern data generating apparatus.

Figure 7:
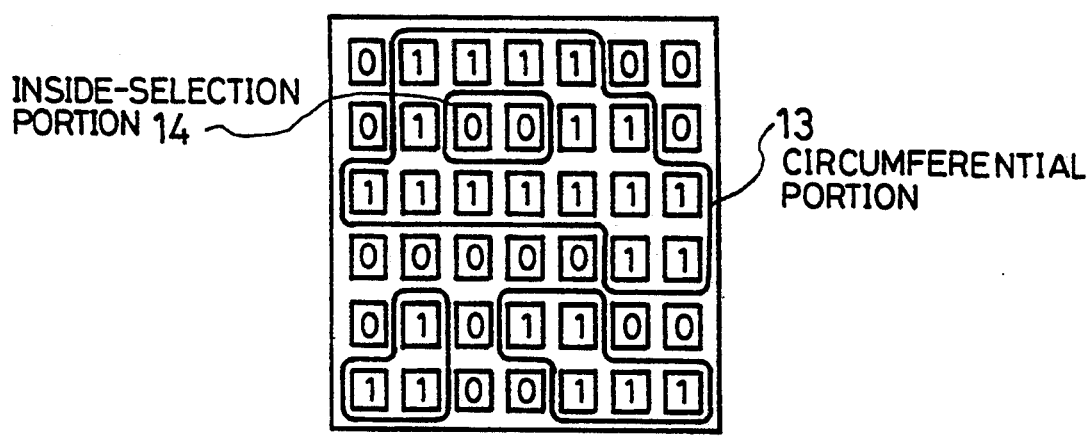
FIG. 7 illustrates one example of truth value data grouped by the FIG. 6 layout pattern generating apparatus.
Figure 8:
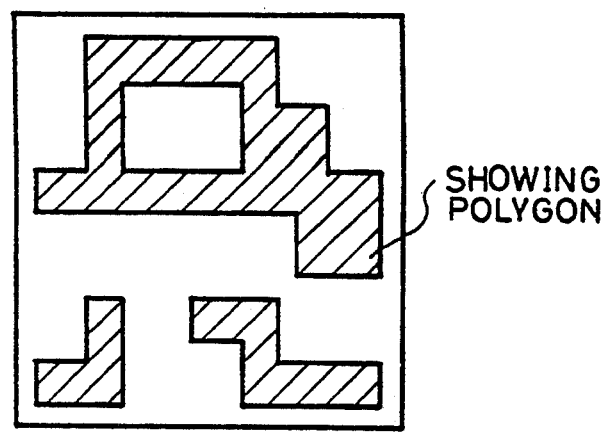
FIG. 8 illustrates one example of a layout pattern corrected by the FIG. 6 layout pattern generating apparatus.

FIG. 7 shows an example of the truth value data grouped. In FIG. 7, numeral 13 represents an outer circumferential portion of the layout pattern data from which the circumferential coordinate value data is extracted, and 14 designates an inside-selection portion of the layout pattern data from which the outside inside-selection coordinate value data is extracted. FIG. 8 shows an example of the corrected layout pattern produced by extracting the coordinate value data at every grouped truth value data.

Figure 9A:
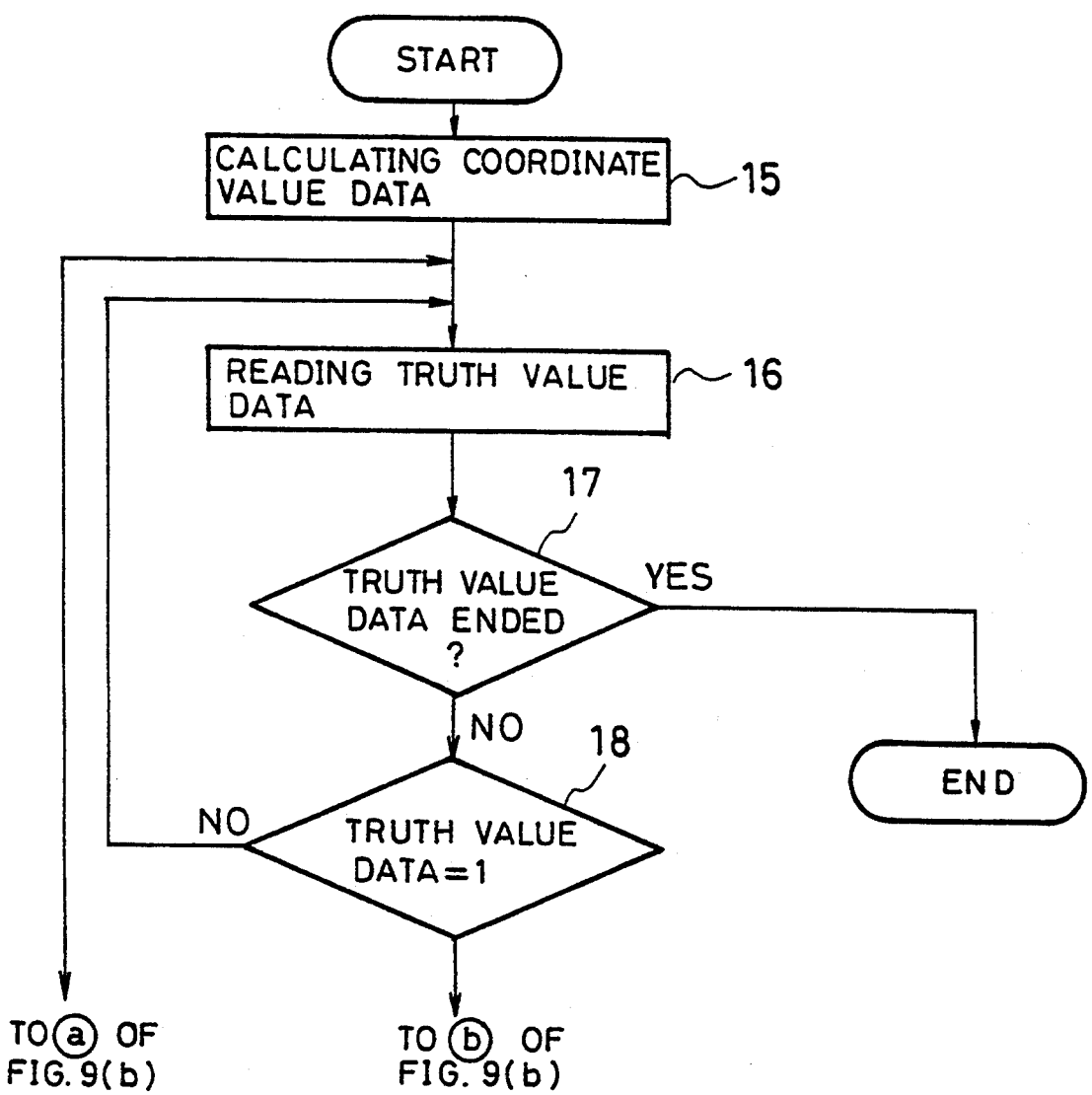
FIGS. 9(a) and (b) flow charts showing an operation of the FIG. 6 layout pattern generating apparatus.
Figure 9B:
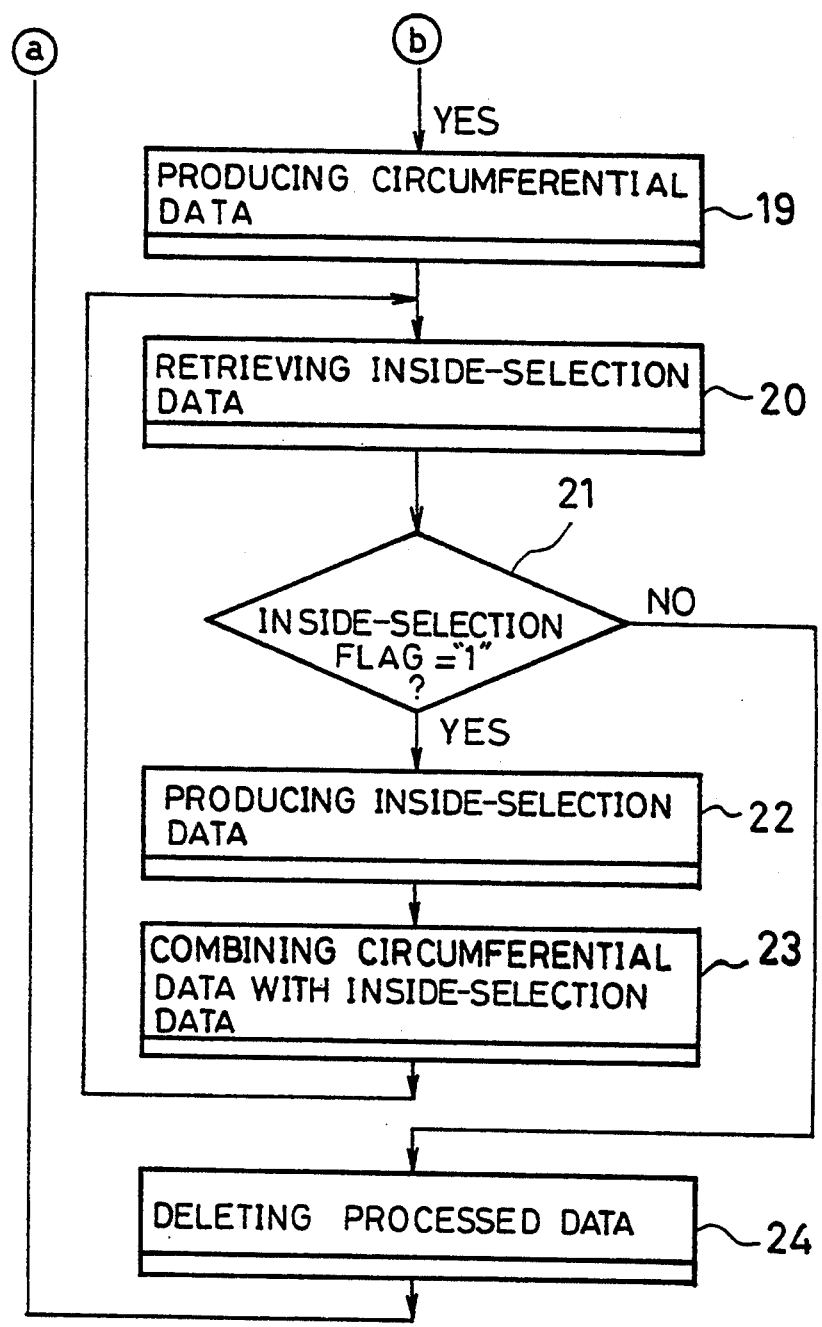

FIGS. 9(a) and (b) are flow charts showing an operation of this layout pattern generating apparatus. The operation will be described with reference to FIGS. 9(a) and (b). First, the coordinate value of the layout pattern to be drawn on a mask is calculated as the pre-treatment of the layout pattern data production and stored in the coordinate value data storing section 6 (step 15). Secondly, the truth value data are read (step 16). This process is similar to the conventional process. Here, when the reading reaches the end of the truth value data, the process is terminated (step 17).

Further, it is checked whether the truth value data read is the data which generates a rectangle (step 18). In the case that the truth value data is the data (truth value data="1") which generates the rectangle, the adjacent truth value data="1" are grouped, while advancing to the circumferential data producing process to produce the layout pattern of the outer circumferential portion of the grouped truth value data. On the other hand, in the case of the data (truth value data="0") which does not generate the rectangle, the operation returns to the process to read the truth value data. While the adjacent truth value data="1" are grouped, the coordinate value data of the outer circumferential portion of the layout pattern to be drawn on the mask are extracted from the coordinate value data storing section 6 at every grouped truth value data so as to produce the circumferential layout pattern data (step 19).

Secondly, it is checked whether the truth value data="0" which does not generate the layout pattern exists in the grouped truth value data="1" (step 20). An inside-selection flag indicative of the presence or absence of the data which does not generate the layout pattern is decided (step 21). In the case of the insideselection flag="1", the operation proceeds to the process to produce the inside-selection data, and in the case of the inside-selection flag="0", the operation advances to the process to delete the processed data. When the inside-selection flag="1", the coordinate value data of the inside-selection portion is extracted from the coordinate value data storing section 6 so as to produce the inside-selection layout pattern data (step 22). The circumferential layout pattern data and the inside-selection layout pattern data are combined with each other so as to produce one layout pattern data (step 23). The production process of the inside-selection data is repeatedly effected until the inside-selection data (truth value data="0") become empty in the grouped truth value data. The truth value data after the layout pattern data production process are deleted so as not to interfere with the layout pattern data production process for the other grouped truth value data (step 24). The above-described operation is repeatedly effected up to the end of the truth value data. If the truth value data have ended, this operation terminates.

Figure 10A:
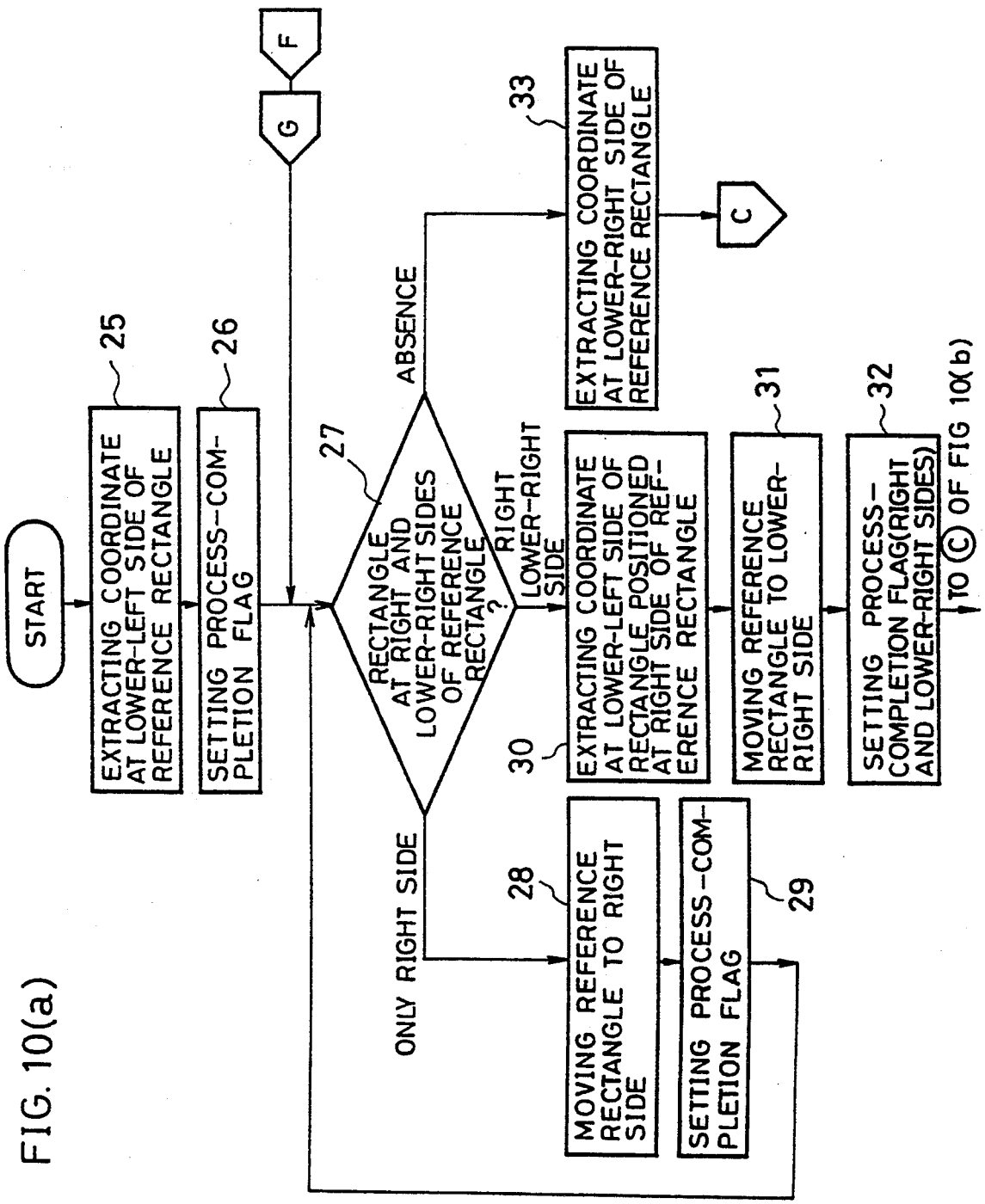
FIGS. 10(a) and (b) flow charts showing an operation for a circumferential data producing process to be effected by the FIG. 6 layout pattern generating apparatus.
Figure 10B:
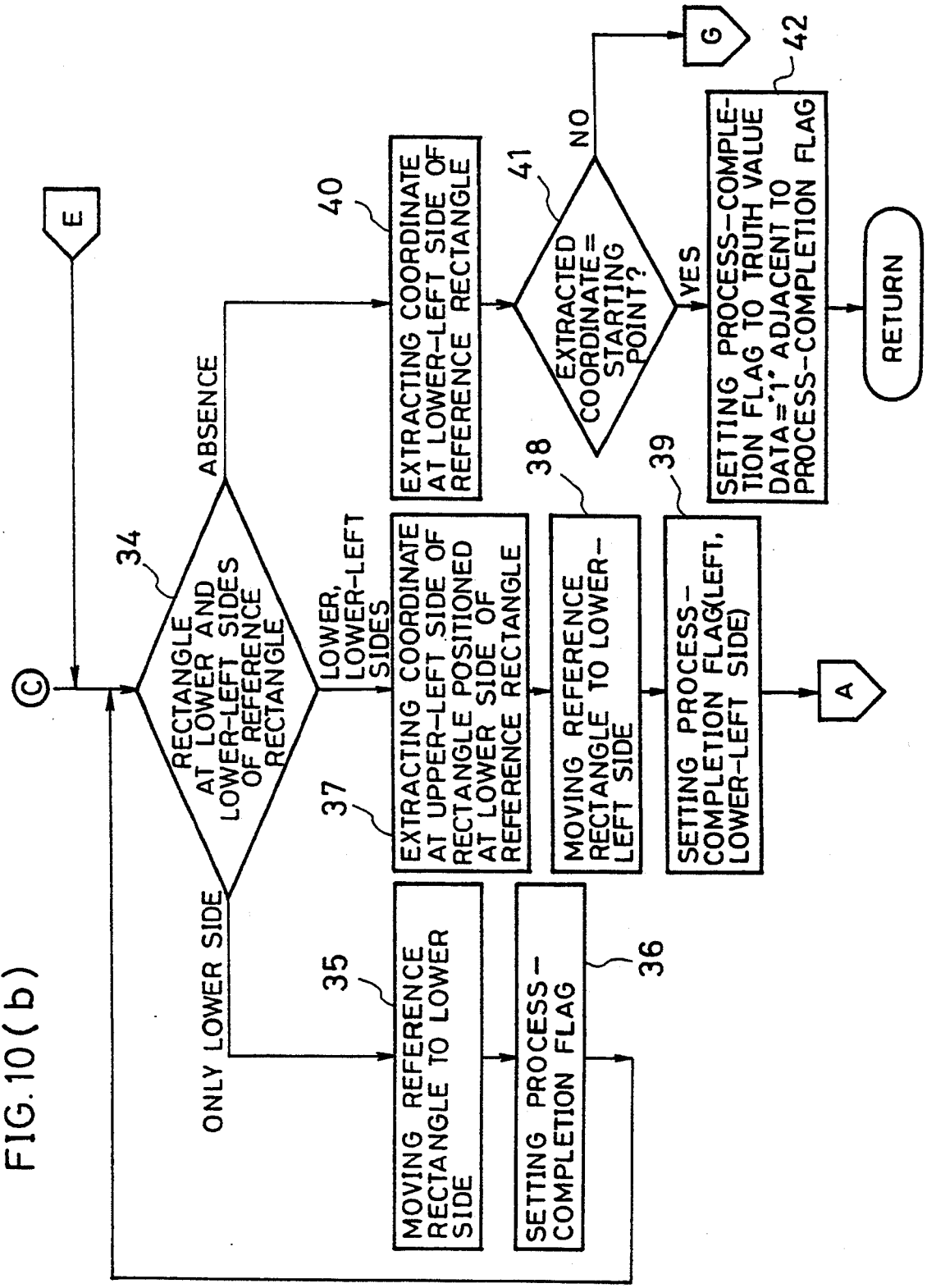
Figure 11A:
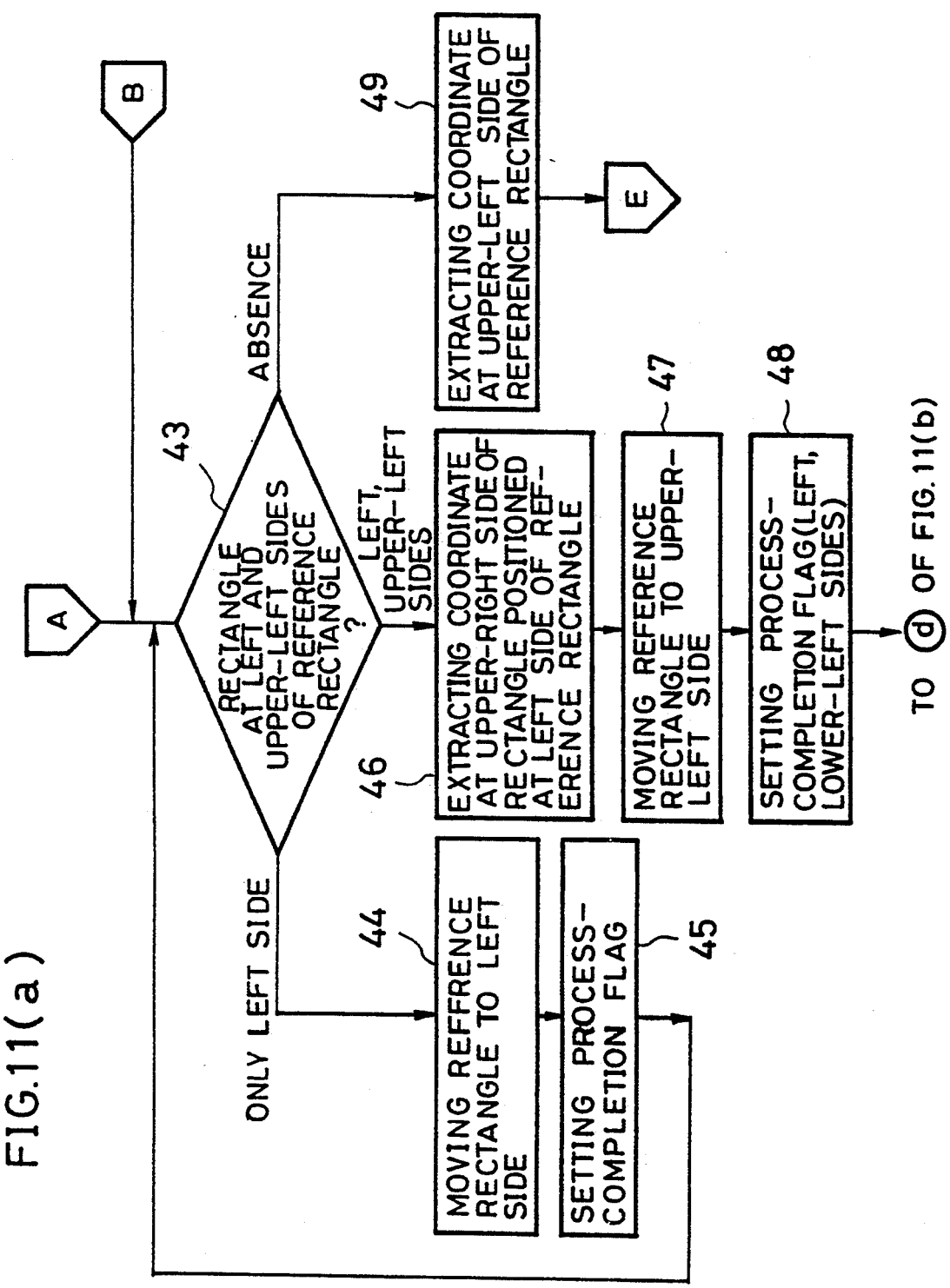
FIGS. 11(a) and (b) is a flow charts subsequent to the FIGS. 10(a) and (b) flow charts.
Figure 11B:
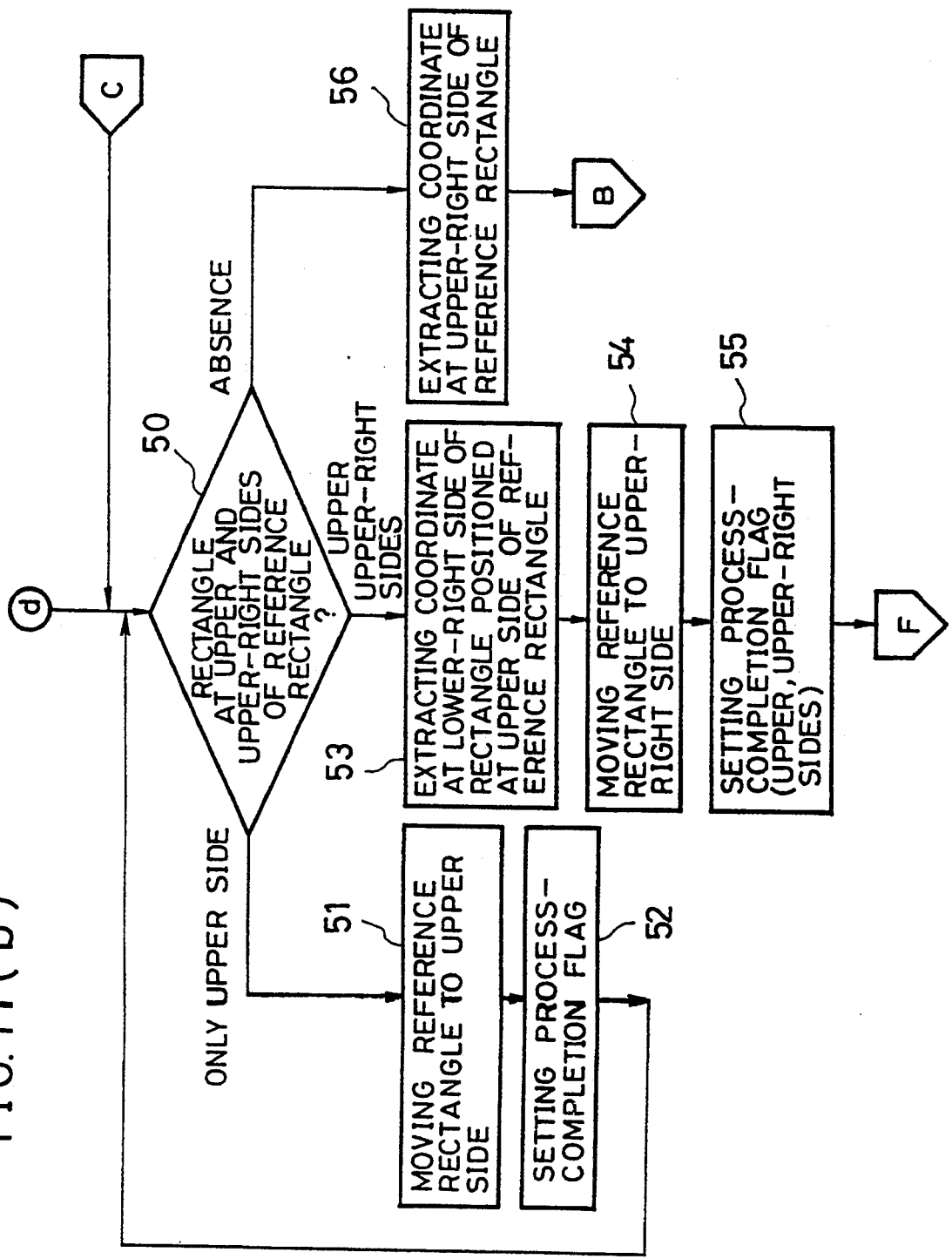

FIGS. 10(a) and (b) 11(a) and (b) are flow charts showing the operation for the circumferential data production process in this layout pattern generating apparatus. The description thereof will be made with reference to FIGS. 10(a) and 10(b) 11(a) and 11(b). First, the coordinate value data positioned at the left-lower side of the rectangle (truth value data="1") which is the reference for the circumferential data production is extracted from the coordinate value data storing section 6 (step 25). This coordinate value data becomes the coordinate of the starting point of the circumferential layout pattern data. A process-completion flag is set with respect to the reference rectangle (the truth value data is set from "1" to "2") (step 26).

Further, it is checked whether or not the rectangle (the truth value data="1") adjacent to the right side and lower-right side of the reference rectangle exists (step 27). If there is the rectangle adjacent to the right or lower-right side of the reference rectangle, the coordinate of the lower-left side of the rectangle positioned at the right side of the reference rectangle is extracted from the coordinate value data storing section 6 (step 30), then moving the reference rectangle to the rectangle at the lower-right side (step 31). At this time, the process-completion flags are set with respect to the rectangles positioned at the right and lower-right side of the reference rectangle (step 32). Thereafter, this operation advances to the process to retrieve whether or not the rectangle adjacent to the lower and lower-left sides of the reference rectangle exists. If there is the rectangle adjacent only to the right side of the reference rectangle, the reference rectangle is moved to the rectangle at the right side (step 28) and the process-completion flag is set with respect to the right side rectangle (step 29). Further, it is again checked whether the rectangle adjacent to the right and lower-right sides of the reference rectangle exists. If no rectangle adjacent to the right or lower-right side of the reference rectangle exists, the coordinate of the lower-right side of the reference rectangle is extracted from the coordinate value data storing section 6 (step 33). Thereafter, this operation proceeds to the process to retrieve whether the rectangle adjacent to the upper and upper-right side of the reference rectangle exists.

It is checked whether the rectangle adjacent to the lower and lower-left sides of the reference rectangle exists (step 34). If the rectangle adjacent to the lower and lower-left sides of the reference rectangle exists, the coordinate of the upper-left side of the rectangle positioned at the lower side of the reference rectangle is extracted from the coordinate value data storing section 6 (step 37) and the reference rectangle is then moved to the lower-left side rectangle (step 38). At this time, the process-completion flags are set with respect to the rectangles positioned at the left and lower-left sides of the reference rectangle (step 39). Then, this operation advances to the process to retrieve whether or not the rectangle adjacent to the left and upper-left sides of the reference rectangle exists.

If the rectangle adjacent only to the lower side of the reference rectangle exists, the reference rectangle is moved to the rectangle positioned at the lower side of the reference rectangle (step 35) and the process-completion flag is set with respect to the lower-side rectangle (step 36). Further, it is checked whether or not the rectangle adjacent to the lower and lower-left sides of the reference rectangle exists. If the rectangle adjacent to the lower or lower-left sides of the reference rectangle does not exist, the coordinate of the lower-left side of the reference rectangle is extracted therefrom (step 40). At this time, it is checked whether or not the extracted coordinate is equal to the coordinate of the starting point (step 41). If the extracted coordinate is equal thereto, the process-completion flags are set all of the truth value data="1" adjacent to the truth value data which is of the grouped truth value data and to which the process-completion flag is set (step 42), then terminating the process. If the extracted coordinate is different from the starting point coordinate, this operation advances to the process to retrieve whether or not the rectangle adjacent to the right and lower-right sides of the reference rectangle exists.

It is checked whether or not the rectangle adjacent to the left and upper-left sides of the reference rectangle exists (step 43). If the rectangle adjacent to the left and upper-left sides of the reference rectangle exists, the coordinate of the upper-right side of the rectangle positioned at the left side of the reference rectangle is extracted from the coordinate value data storing section 6 (step 46) and the reference rectangle is moved to the upper-left rectangle (step 47). At this time, the process-completion flags are set to the rectangles at the left and upper-left sides of the reference rectangle (step 48). Then, the operation proceeds to the process which is for retrieving whether or not the rectangle adjacent to the upper and upper-right sides of the reference rectangle exists. If the rectangle adjacent only to the left side of the reference rectangle exists, the reference rectangle is moved to the left side rectangle (step 44), and the process-completion flag is set to the left side rectangle (step 45). Further, it is again checked whether or not the rectangle adjacent to the left and upper-left sides of the reference rectangle exists. If the rectangle adjacent to the left and upper-left sides of the reference rectangle does not exist, the coordinate of the upper-left side of the reference rectangle is extracted from the coordinate value data storing section 6 (step 49). Then, this operation advances to the process which is for retrieving whether or not the rectangle adjacent to the lower and lower-left side of the reference rectangle exists.

It is checked whether or not the rectangle adjacent to the upper and upper-right sides of the reference rectangle exists (step 50). If the rectangle adjacent to the upper and upper-right side of the reference rectangle exists, the coordinate of the lower-right side of the rectangle positioned at the upper side of the reference rectangle is extracted from the coordinate value data storing section 6 (step 53), and the reference rectangle is moved to the upper-right rectangle (step 54). At this time, the process-completion flags are set with respect to the rectangles at the upper and upper-right side of the reference rectangle (step 55). Then, this operation proceeds to the process which is for retrieving whether or not the rectangle adjacent to the right and lower-right sides of the reference rectangle exists. If there is the rectangle adjacent only to the upper side of the reference rectangle exists, the reference rectangle is moved to the upper side rectangle (step 51) and the process-completion flag is set with respect to the upper side rectangle (step 52). Further, the process is again effected which checks whether or not the rectangle adjacent to the upper and upper-right sides of the reference rectangle exists. If there is no rectangle adjacent to the upper and upper-right sides of the reference rectangle, the coordinate of the upper-right side of the reference rectangle is extracted from the coordinate value data storing section 6 (step 56). Then, the operation advances to the process to retrieve whether or not the rectangle adjacent to the left and upper-left sides of the reference rectangle exists.

The above-described 4 types of retrieving processes (steps 27, 34, 43 and 50) are effected until the coordinate of the layout pattern extracted is coincident with the coordinate of the layout pattern initially extracted. If being coincident therewith, the operation terminates.

Figure 12:
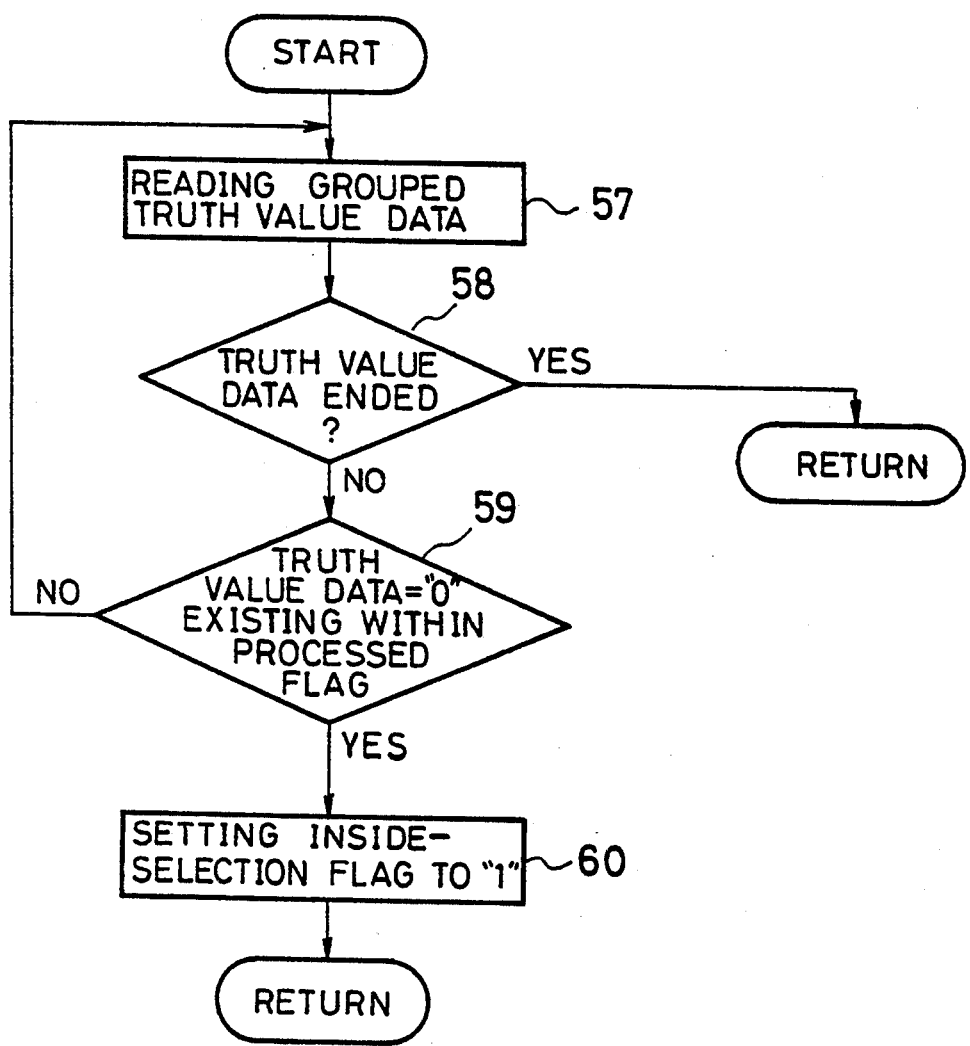
FIG. 12 is a flow chart showing an operation of an inside-selection data retrieving process to be effected by the FIG. 6 layout pattern generating apparatus.
Figure 13A:
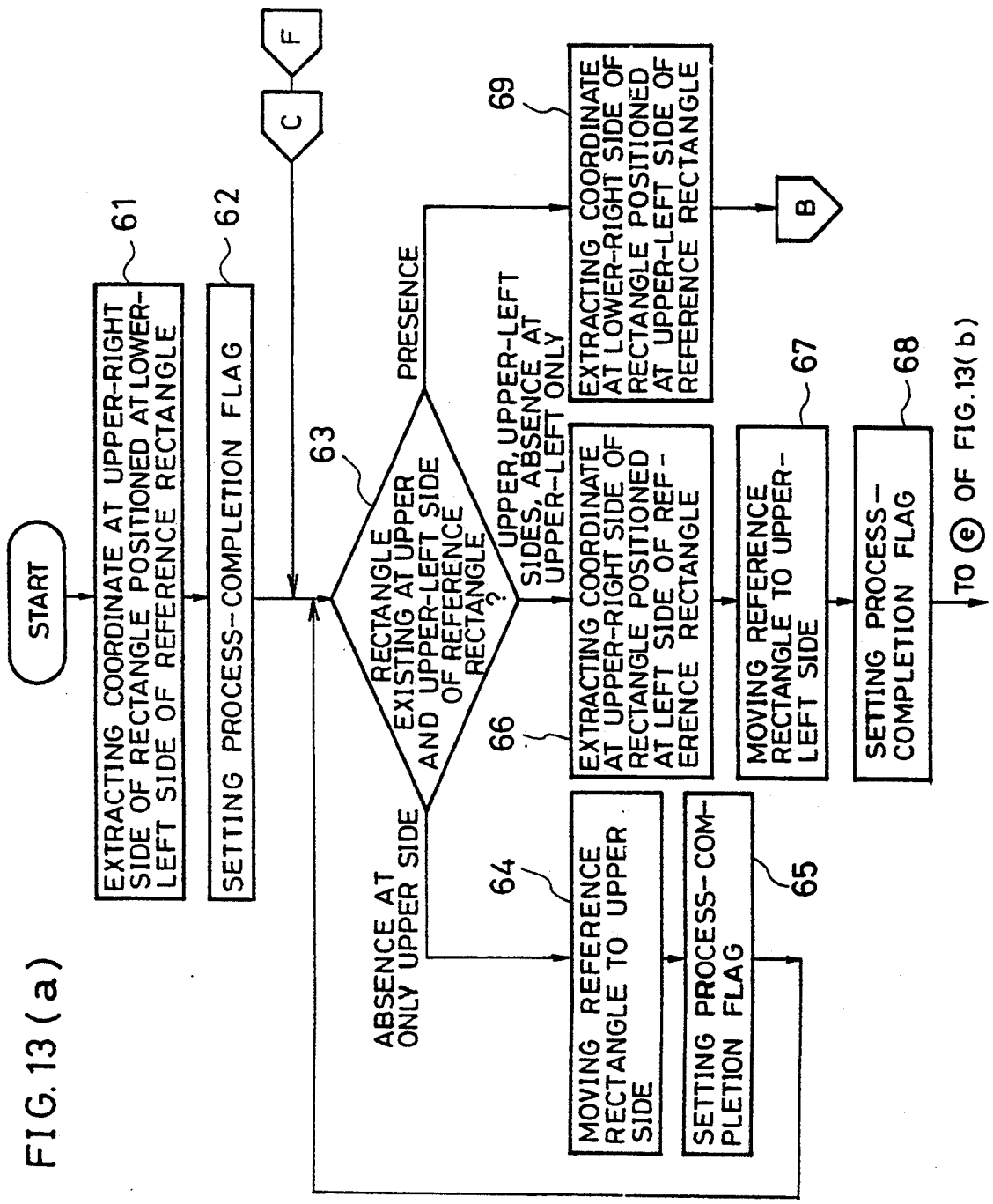
FIGS. 13(a) and (b) flow charts showing an operation for an inside-selection data producing process to be effected by the FIG. 6 layout pattern generating apparatus.
Figure 13B:
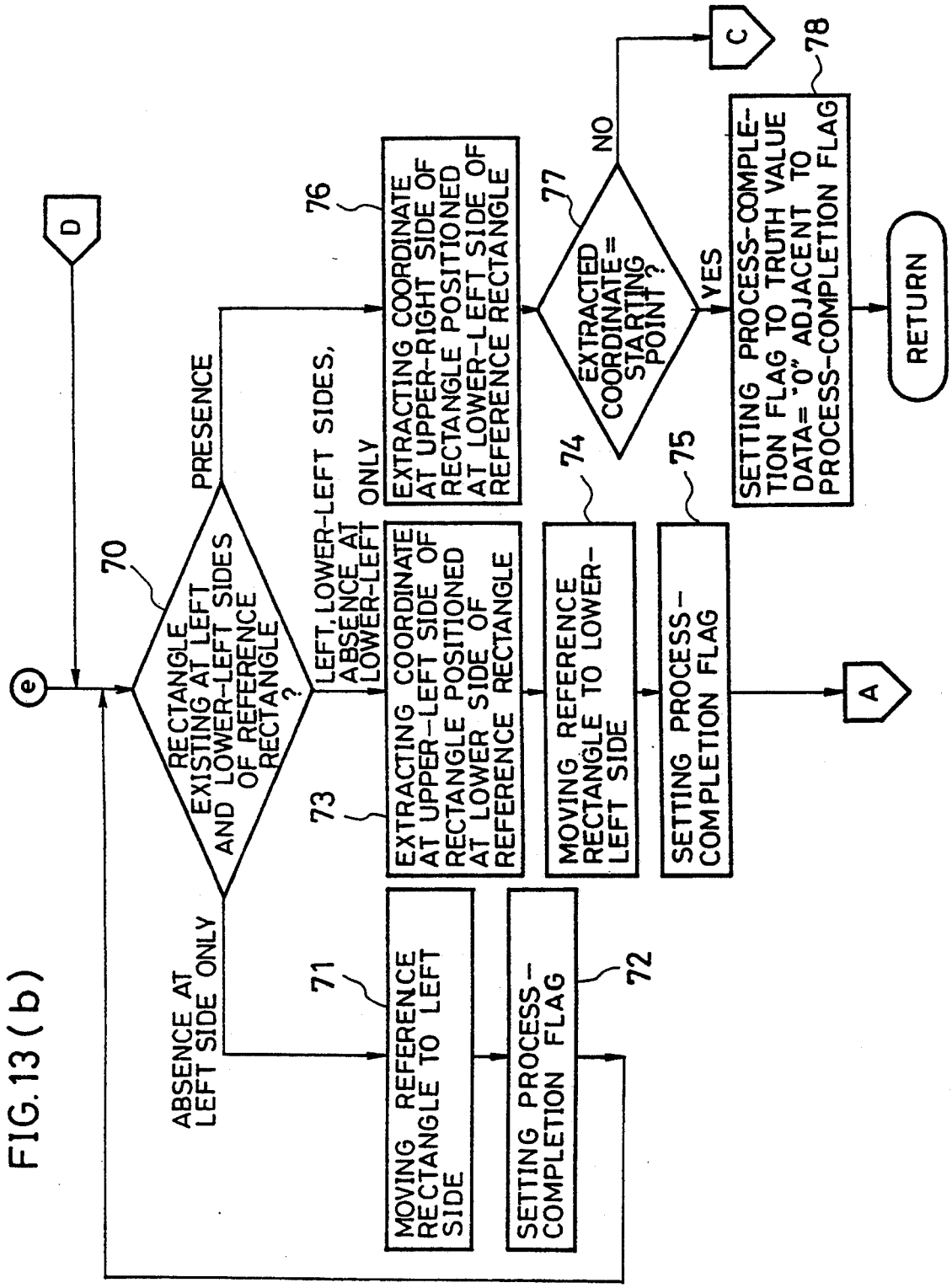
Figure 14A:
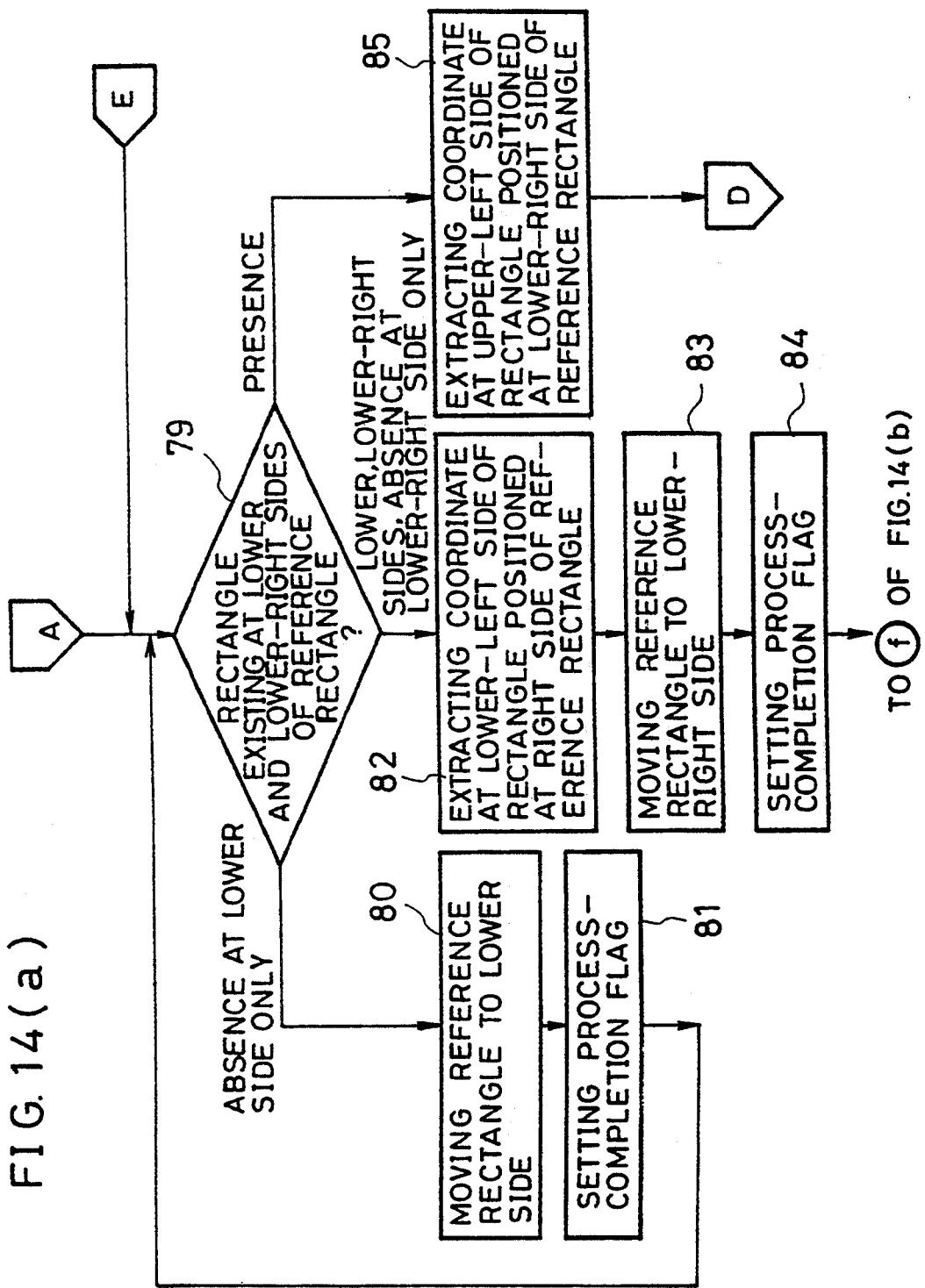
FIGS. 14(a) and (b) is a flow charts subsequent to the FIG. 13 flow chart.
Figure 14B:
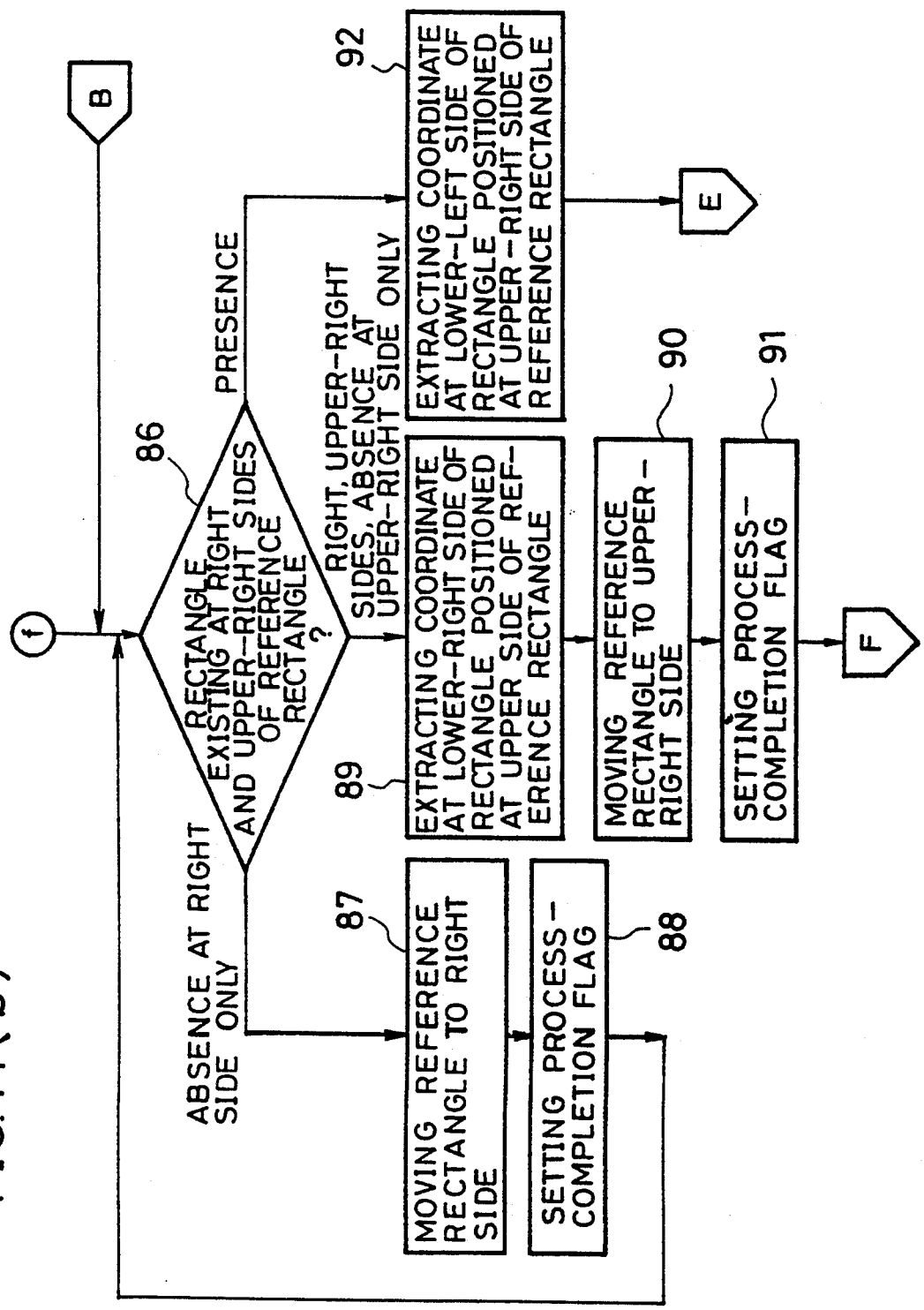

FIG. 12 is a flow chart showing the operation for the insideselection data retrieving process in the layout pattern generating apparatus, The operation will be described hereinbelow with reference to FIG. 12, First, the grouped truth value data is read (step 57). at this time, the process-completion flags are set with respect to all of the outsides of the truth value data. Here, it is checked wither or not the truth value data have ended (step 58). If coming to an end, the process terminates.

It is checked whether or not data (truth value data="0") which does not generate a rectangle exists between the process-completion flags within the same X line segment (step 59). If the data which does not generate the rectangle exists between the process-completion flags within the same X line segment, the inside-selection indicative of the fact that the inside-selection exists is set (the inside-selection flag f "1") (step 60).

FIGS. 13(a) and 13(b) 14(a) and 14(b) are flow charts showing the operation for the inside-selection data production process in the layout pattern generating apparatus. The operation will be described hereinbelow with reference to FIGS. 13 and 14. First, the coordinate value data at the upper-right side of the rectangle positioned at the lower-left side of the rectangle (truth value data="0") which becomes a base (reference) for the inside-selection data production is extracted from the coordinate value data storing section 6 (step 61). This coordinate value data becomes the coordinate of the starting point of the inside-selection layout pattern data. The process-completion flag is set to the reference rectangle (the truth value data="0" is changed to "2") (step 62).

It is checked whether or not the rectangle (truth value data="0") which does not generate the coordinate and which is adjacent to the upper and upper-left sides of the reference rectangle exist s(step 63). If the rectangle adjacent to the upper and upper-left sides of the reference rectangle or adjacent only to the upper-left side thereof does not exist, the coordinate of the upper-right side of the rectangle positioned at the left side of the reference rectangle is extracted from the coordinate value data storing section 6 (step 66) and the reference rectangle is moved to the upper-left rectangle (step 67). At this time, if the rectangle adjacent to the upper and the upper-left side of the reference rectangle does not exist, the process-completion flags are set to the upper and upper-left sides of the reference rectangle (step 68). Further, this operation advances to the process to retrieve whether the rectangle adjacent to the left and lower-left sides of the reference rectangle.

If the the rectangle adjacent only to the upper side of the reference rectangle does not exist, the reference rectangle is moved to the upper side rectangle (step 64) and the process-completion flag is set with respect to the upper side rectangle (step 65). Further, it is again checked whether or not the rectangle adjacent to the upper and upper-left sides of the reference rectangle exists. If the rectangle adjacent to the upper and upper-left sides of the reference rectangle exists, the coordinate of the lower-right side of the rectangle positioned at the upper-left side of the reference rectangle is extracted from the coordinate value data storing section 6 (step 69). Then, this operation advances to the process to retrieve whether or not the rectangle adjacent to the right and upper-right sides of the reference rectangle exists.

It is checked whether or not the rectangle which is adjacent to the left and lower-left sides of the reference rectangle and which does not generate the coordinate value exists (step 70). If there is no rectangle adjacent to the left and lower-left sides of the reference rectangle or adjacent only to the lower-left side thereof, the coordinate of the upper-left side of the rectangle positioned at the lower side of the reference rectangle is extracted from the coordinate value data storing section 6 (step 73) and the reference rectangle is moved to the lower-left side rectangle (step 74). At this time, if the rectangle adjacent to the left and lower-left sides of the reference rectangle does not exist, the process-completion flags are set with respect to the left and lower-left sides of the reference rectangle, and if the the rectangle adjacent only to the lower-left side of the reference rectangle does not exist, the process-completion flag is set with respect to the lower-left side of the reference rectangle (step 75). Further, this operation proceeds to retrieve whether or not the rectangle adjacent to the lower and lower-left sides of the reference rectangle exists.

When there is no rectangle adjacent only to the left side of the reference rectangle, the reference rectangle is moved to the left side rectangle (step 71) and the process-completion flag is set to the left side rectangle (step 72). Moreover, it is again checked whether or not the rectangle adjacent to the left and lower-left sides of the reference rectangle exists. When the rectangle adjacent to the left and lower-left sides of the reference rectangle exists, the coordinate of the upper-right side of the rectangle positioned at the lower-left side of the reference rectangle is extracted from the coordinate value data storing section 6 (step 76). At this time, it is checked whether or not the extracted coordinate is equal to the coordinate of the starting point (step 77). If being equal to the starting point coordinate, the process-completion flags are set with respect to the all of the truth value data="0" adjacent to the truth value data of the grouped truth value data to which the process-completion flag is set (step 78), thereafter terminating the process. On the other hand, if being not equal to the starting point coordinate, this operation proceeds to the process which is for retrieving whether not not the rectangle adjacent to the upper and upper-left sides of the reference rectangle exists.

It is checked whether or not the rectangle which is adjacent to the lower and lower-right sides of the reference rectangle and which does not generate the coordinate value exists (step 79). If there is not rectangle adjacent to the lower and lower-right sides of the reference rectangle or adjacent only to the lower-right side thereof, the coordinate of the lower-right side of the rectangle positioned at the right side of the reference rectangle is extracted from the coordinate value data storing section 6 (step 82) and the reference rectangle is moved to the lower-right side rectangle (step 83). At this time, if there is not rectangle adjacent to the lower and upper-right sides of the reference rectangle, the process-completion flags are set with respect to the lower and lower-right sides of the reference rectangle, and if there is no rectangle adjacent only to the lower-right side of the reference rectangle, the process-completion flag is set with respect to the lower-right side of the reference rectangle (step 84). Further, this operation advances to the process to retrieve whether or not the rectangle adjacent to the right and upper-right sides of the reference rectangle exists.

If there is not rectangle adjacent only to the lower side of the reference rectangle, the reference rectangle is moved to the lower side rectangle (step 80) and the process-completion flag is set with respect to the upper side rectangle (step 81). Moreover, it is again checked whether or not the rectangle adjacent to the lower and lower-right sides of the reference rectangle exists. When the rectangle adjacent to the lower and lower-right sides of the reference rectangle exists, the coordinate of the upper-left side of the rectangle positioned at the lower-right side of the reference rectangle is extracted from the coordinate value data storing section 6 (step 85). Further, this operation advances to the process to retrieve whether or not the rectangle adjacent to the left and lower-left sides of the reference rectangle exists.

It is checked whether or not there is the rectangle which is adjacent to the right and upper-right sides of the reference rectangle and which does not generate the coordinate (step 86). When the rectangle adjacent to the right and upper-right sides of the reference rectangle or adjacent only to the upper-right thereof does not exist, the coordinate of the lower-right side of the rectangle positioned at the upper side of the reference rectangle is extracted from the coordinate value data storing section 6 (step 89), and the reference rectangle is moved to the upper-right side rectangle (step 90). At this time, if there is no rectangle adjacent to the right and upper-right sides of the reference rectangle, the process-completion flags are set with respect to the right and upper-right sides of the reference rectangle, and if there is no rectangle adjacent only to the upper-right side of the reference rectangle, the process-completion flag is set to the upper-right side of the reference rectangle (step 91). Further, this operation advances to the process to retrieve whether or not the rectangle adjacent to the upper and upper-left sides of the reference rectangle exists.

If there is no rectangle adjacent only to the right side of the reference rectangle, the reference rectangle is moved to the right side rectangle (step 87) and the process-completion flag is set with respect to the right side rectangle (step 88). Further, the process is again effected which checks whether or not the rectangle adjacent to the right and upper-right sides of the reference rectangle exists. If there is the rectangle adjacent to the right and upper-right sides of the reference rectangle, the coordinate of the lower-left side of the rectangle positioned at the upper-right side of the reference rectangle is extracted from the coordinate value data storing section 6 (step 92) Further, this operation proceeds to the process to retrieve whether or not the rectangle adjacent to the lower and lower-right sides of the reference rectangle exists.

The above-described 4 retrieving processes (steps 63, 70, 79 and 86) are effected until the coordinate of the extracted layout pattern is coincident with the coordinate of the initially extracted layout pattern. If being coincident therewith, the processes terminate.

Figure 15:
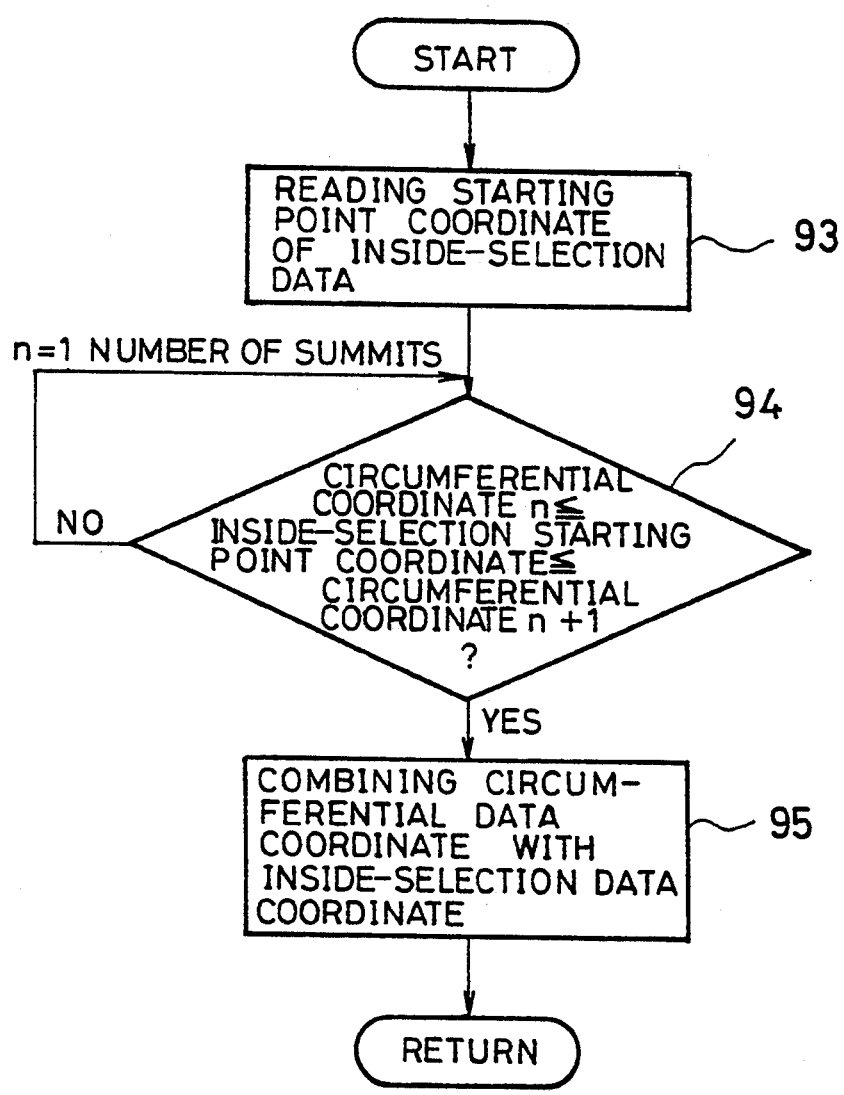
FIG. 15 is a flow chart showing an operation for a combination process of circumferential data and inside-selection data to be effected by the FIG. 6 layout pattern generating apparatus.

FIG. 15 is a flow chart showing the operation for combination process of the circumferential data and the inside-selection data in the layout pattern generating apparatus. The operation will be described hereinbelow with reference to FIG. 15. First, the coordinate of the starting point for the inside-selection layout pattern data is read (step 93). The coordinate value of the circumferential layout pattern data is read and the position of the starting point of the inside-selection layout pattern data in the circumferential layout pattern data is retrieved (step 94). If the position of the circumferential data and the inside-selection data are found, the circumferential data and the inside-selection data are combined with each other so as to produce the correction-processed layout pattern data (step 95).

Figure 16:
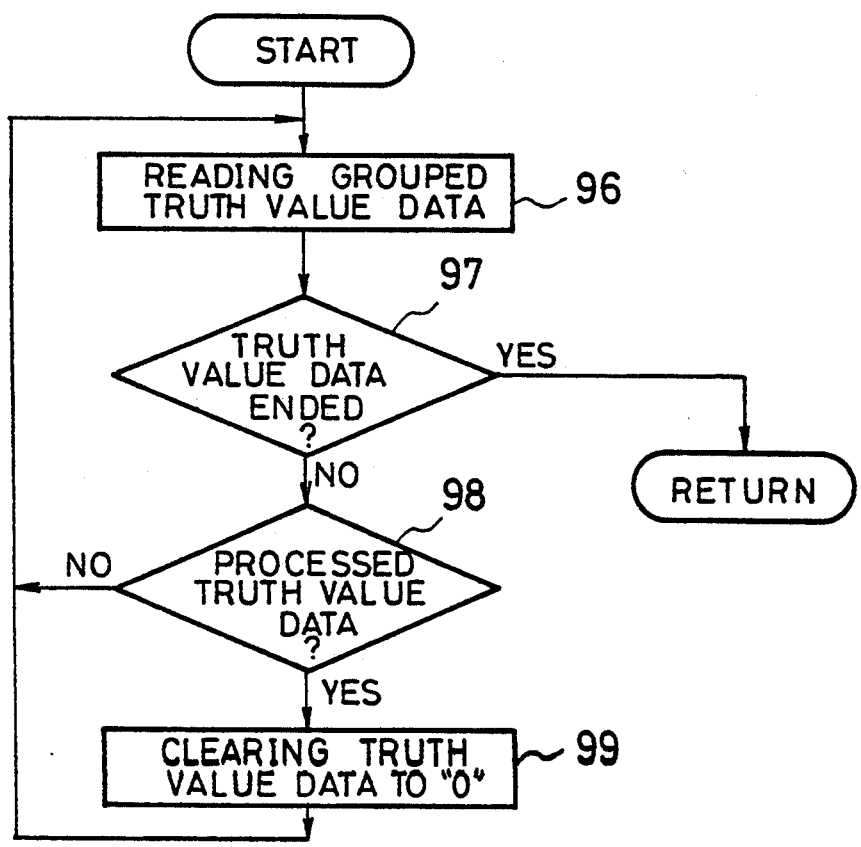
FIG. 16 is a flow chart showing an operation for a deletion process of processed data to be effected by the FIG. 6 layout pattern generating apparatus.

FIG. 16 is a flow chart showing the operation for deletion process of the processed data in the ROM layout pattern data production flow. The operation will be described hereinbelow with reference to FIG. 16. First, the grouped truth value data after the production of the layout pattern data is read (step 96). Here, it is checked whether or not the truth value data come to an end (step 97). If ended, the process terminates. It is checked whether or not the read processed truth value data is the processed truth value data (truth value data="2") (step 98). If being the processed truth value data, the truth value data is cleared (truth value data="0") (step 99).

Embodiment 3

Although in the above-described embodiments the correction process of the layout pattern is effected in both the longitudinal direction and transverse direction, it is appropriate that the correction process of the layout pattern is effected in either the longitudinal direction or transverse direction. In this case, it is possible to offer the same effect as the above-described embodiments.

Figure 17:
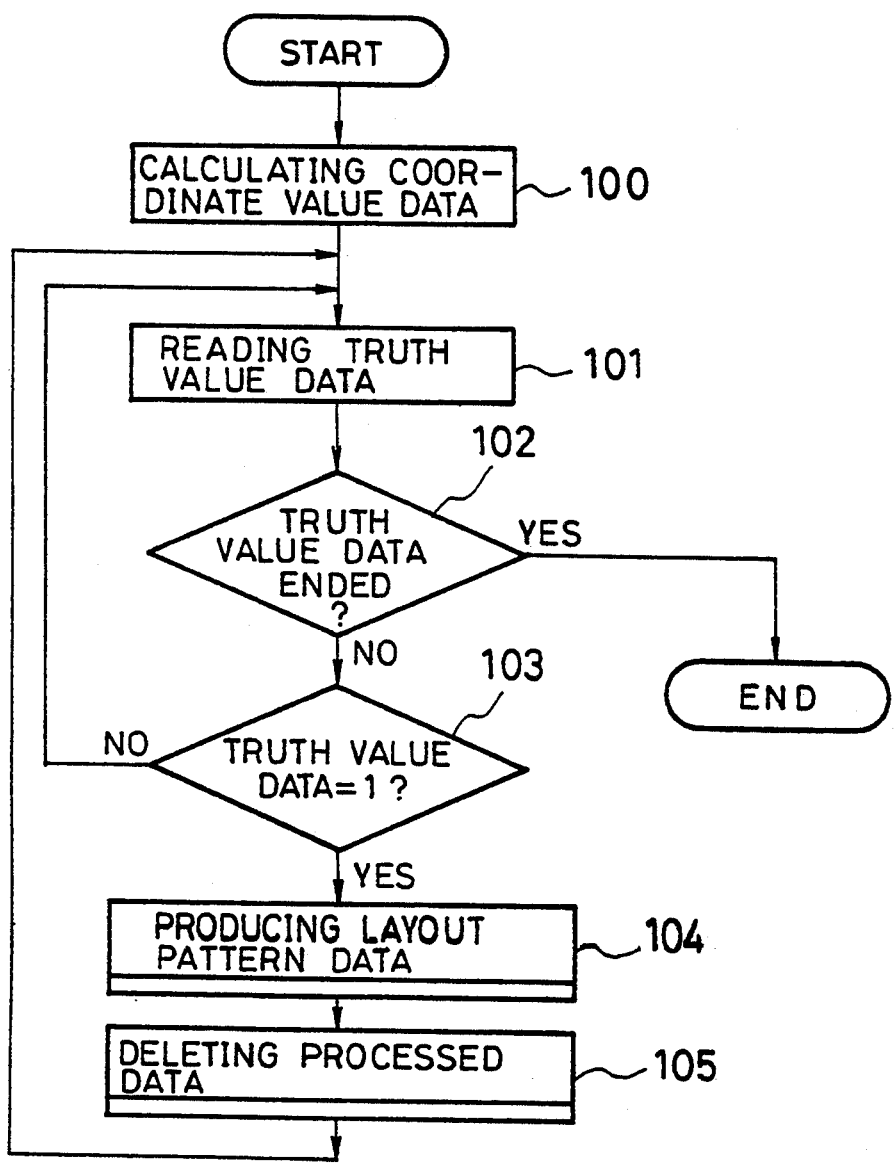
FIG. 17 is a flow chart showing an operation of a layout pattern generating apparatus according to an embodiment, defined in the claim 3, where a correction process of a layout pattern is effected only one of the longitudinal and transverse directions.

The embodiment 3 of this invention will be described hereinbelow with reference to the drawings. FIG. 17 is a flow chart showing the operation of the layout pattern generating apparatus according to an embodiment of the invention defined in the claim 3 where the correction process of the layout pattern is effected only in one of the longitudinal direction and the transverse direction. The operation will be described hereinbelow with reference to FIG. 17. First, as the pretreatment for the production of the layout pattern data, the coordinate of the layout pattern to be drawn on a mask is calculated and stored in the coordinate value data storing section 6

(step 100), This process is the same as in the embodiment 2. Secondly, the truth value data are read (step 101). This process is the same as the embodiment 2. Here, the truth value data come to an end, this process terminates (step 102). It is checked whether or not the read truth value data are the data which generates an rectangle (step 103). This process is the same as the embodiment 2.

While the truth value data="1" adjacent to each other in the longitudinal direction or the transverse direction are grouped, the layout pattern to be drawn on the mask data are produced at every grouped truth value data (step 104). The truth value data processed for the production of the layout pattern data are deleted (the truth value data="2" is changed to the truth value data="0") (step 105).

The above-described operation is repeatedly effected until the truth value data come to an end. Further, If the truth value data end, the process terminates.

Figure 18:
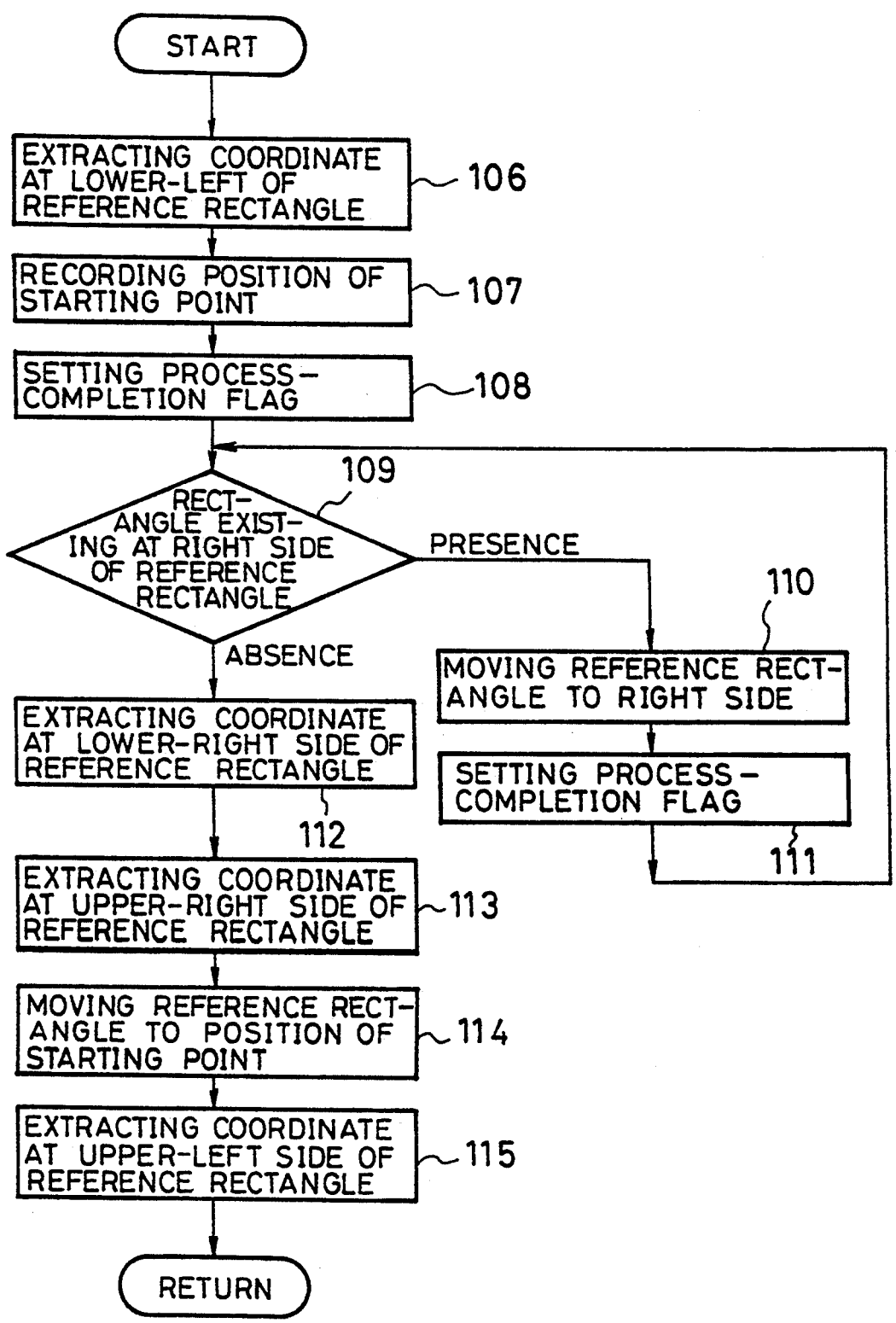
FIG. 18 is a flow chart showing an operation for a layout pattern correcting process to perform a layout pattern correcting process only in the transverse direction.

FIG. 18 is a flow chart showing the operation for the layout pattern data production process to perform the correction of the layout pattern only in the transverse direction. The operation will be described hereinbelow with reference to FIG. 18. First, the coordinate of the lower-left of the reference rectangle is extracted from the coordinate value data storing section 6 (step 106). The position of the reference rectangle is stored (step 107). This position is the position of the starting point. The process-completion flag is set with respect to the reference rectangle (step 108). A process is effected which retrieves whether or not the rectangle adjacent to the right side of the reference rectangle exists (step 109). If there is the rectangle adjacent thereto, the reference rectangle is moved to the right side (step 110) and the process-completion flag is set with respect tot he right side rectangle (step 111). Further, the process is again effected which retrieves whether or not the rectangle adjacent to the right side of the reference rectangle exists. When there is no rectangle adjacent to the right side of the reference rectangle, the coordinate of the lower-right side of the reference rectangle is extracted from the coordinate value data storing section 6 (step 112). The coordinate of the upper-right side of the reference rectangle is extracted from the coordinate value data storing section 6 (step 113). The reference rectangle is moved up to the position of the starting point (step 114) and the coordinate of the upper-left side of the reference rectangle is extracted from the coordinate value data storing section 6 (step 115), thereafter terminating the process.

FIG. 19 is a flow chart showing the operation for the layout pattern data production process to perform the correction of the layout pattern only in the longitudinal direction. The operation will be described hereinbelow with reference to FIG. 19. First, the coordinate of the lower-left side of the reference rectangle is extracted from the coordinate value data storing section 6 (step 116) and the coordinate of the lower-right side of the reference rectangle is extracted from the coordinate value data storing section 6 (step 117). The process-completion flag is set with respect to the reference rectangle (step 118). Further, a process is effected which retrieves whether or not the rectangle adjacent to the upper side of the reference rectangle exists (step 119). If there is the rectangle adjacent thereto, the reference rectangle is moved to the upper side (step 122) and the process-completion flag is set with respect to the right side rectangle (step 123). Further, the process is again effected which retrieves whether or not the rectangle adjacent to the upper-right side of the reference rectangle exists.

If there is no rectangle adjacent to the upper side of the reference rectangle, the coordinate of the upper-right side of the reference rectangle is extracted from the coordinate value data storing section 6 (step 120), and the coordinate of the upper-left of the reference rectangle is extracted from the coordinate value data storing section 6 (step 121), thereafter terminating the process.

As described above, according to the inventions defined in the claims 1 to 4, the truth value data having the same value and adjacent to each other are grouped and the coordinate data are calculated at every grouped truth value data so as to produce the layout pattern. Thus, it is possible to obtain a polygonal mask ROM layout pattern having a polygon. Therefore, the data amount of the layout pattern can be reduced so as to reduce the disc amount to be necessary for this process and further to shorten the processing time.

What is claimed is:

1. A layout pattern generating apparatus for generating a layout pattern to be used in creating a light-cutting pattern on a mask utilized for writing ROM data, corresponding to a selected truth table, in the form of a mask ROM comprising an array of rectangular memory cells, with the location on the layout pattern of the corners of each memory cell specified by coordinate data, and with the mask ROM fabricated on a large scale integrated circuit, said pattern generating apparatus comprising:

truth table storage means for storing said selected truth table;

truth value data reading means, coupled to said truth table storage means, for successively reading truth value data having a value of either logic "1" or "0" and for arranging the truth table data so that each truth value read corresponds to a memory cell in said layout pattern, truth value data grouping means for, coupled to said truth value data reading means to receive said truth value data successively read by said truth value reading means, for determining whether a received truth value corresponding to a particular memory cell is adjacent to a memory cell corresponding to a previously read truth value having the same logic value as the received truth value to form a group of adjacent memory cells of data having the same logic value, and coordinate value data calculating means, coupled to said truth value data grouping means, for extracting circumferential coordinate data locating a boundary on said layout pattern of said group of adjacent memory cells, with said boundary representing the boundary of a light-cutting pattern on said layout pattern, and with said circumferential coordinate data used to manufacture a mask for writing ROM data corresponding to said selected truth table to a mask ROM fabricated on a large scale integrated circuit.

2. A layout pattern generating apparatus for generating a layout pattern to be used in creating a light-cutting pattern on a mask utilized for writing ROM data, corresponding to a selected truth table, in the form of a mask ROM comprising an array of rectangular memory cells, with the location on the layout pattern of the corners of each memory cell specified by coordinate data, with the mask ROM fabricated on a large scale integrated circuit, said pattern generating apparatus comprising:

truth table storage means for storing said selected truth table;

truth value data reading means, coupled to said truth table storage means, for successively reading truth value data having a value of either logic "1" and for arranging the truth table data so that each truth value read corresponds to a memory cell in said layout pattern, truth value data grouping means, coupled to said truth value data reading means to receive said truth value data having a value of logic "1" successively read by said truth value reading means, for determining whether another memory cell corresponding to a previously received truth value of logic "1" is located immediately above, below, to the right, or to the left of a memory cell corresponding to said received truth value to form a group of adjacent memory cells corresponding to received truth values of logic "1", coordinate value data calculating means for calculating the coordinate values of said memory cells on the layout pattern to be drawn on a mask, and layout pattern producing means, coupled to said truth value data grouping means and said coordinate value calculating means, including circumferential coordinate value data extracting means for extracting circumferential coordinate data locating a boundary on said layout pattern of said group of memory cells, with said boundary representing the boundary of a light-cutting pattern on said layout pattern, and with said circumferential coordinate data used to manufacture a mask for writing ROM data corresponding to said selected truth table to a mask ROM fabricated on a large scale integrated circuit.

3. A layout pattern generating apparatus for generating a layout pattern to be used in creating a light-cutting pattern on a mask utilized for writing ROM data, corresponding to a selected truth table, in the form of a mask ROM comprising an array of rectangular memory cells, with the location on the layout pattern of the corners of each memory cell specified by coordinate data, with the mask ROM fabricated on a large scale integrated circuit, said pattern generating apparatus comprising:

truth table storage means for storing said selected truth table;

truth value data reading means, coupled to said truth table storage means, for successively reading truth value data having a value of either logic "1" and for arranging the truth table data so that each truth value corresponds to a memory cell in said layout pattern, truth value data grouping means, coupled to said truth value data reading means to receive said truth value data having a value of logic "1" successively read by said truth value reading means, for determining whether another memory cell corresponding to a previously received truth value of logic "1" is located longitudinally immediately above or below or transversely immediately to the right or to the left of a memory cell corresponding to said received truth value to form a longitudinal group of adjacent memory cells or a transverse group of memory cells corresponding to received truth values of logic "1", coordinate value data calculating means for calculating the coordinate values of said memory cells on the layout pattern to be drawn on a mask, and layout pattern producing means, coupled to said truth value data grouping means and said coordinate value calculating means, including circumferential coordinate value data extracting means for extracting circumferential coordinate data locating a boundary on said layout pattern of said either said longitudinal or transverse group of memory cells, with said boundary representing the boundary of a light-cutting pattern on said layout pattern, and with said circumferential coordinate data used to manufacture a mask for writing ROM data corresponding to said selected truth table to a mask ROM fabricated on a large scale integrated circuit.

4. A layout pattern generating apparatus for generating a layout pattern to be used in creating a light-cutting pattern on a mask utilized for writing ROM data, corresponding to a selected truth table, in the form of a mask ROM comprising an array of rectangular memory cells, with the location on the layout pattern of the corners of each memory cell specified by coordinate data, with the mask ROM fabricated on a large scale integrated circuit including a mask ROM, said pattern generating apparatus comprising:

truth table storage means for storing said selected truth table;

truth value data reading means, coupled to said truth table storage means, for successively reading truth value data having a value of either logic "1" or logic "0" and for arranging the truth table data so that each truth value corresponds to a memory cell in said layout pattern, truth value data grouping means, coupled to said truth value data reading means to receive said truth value data having a value of logic "1" successively read by said truth value reading means, for determining whether another memory cell corresponding to a previously received truth value of logic "1" is located immediately above, below, to the right, or to the left of a memory cell corresponding to said received truth value to form a group of adjacent memory cells corresponding to received truth values of logic "1", coordinate value data calculating means for calculating the coordinate values of said memory cells on the layout pattern to be drawn on a mask, and layout pattern producing means, coupled to said truth value data grouping means and said coordinate value calculating means, including circumferential coordinate value data extracting means for extracting circumferential coordinate data locating an outside boundary on said layout pattern of said group of adjacent memory cells, with said boundary representing the outside boundary of a light-cutting pattern on said layout pattern, and with said circumferential coordinate data used to manufacture a mask for writing ROM data corresponding to said selected truth table to a mask ROM fabricated on a large scale integrated circuit, said layout pattern producing means including;

inside-section data retrieving means, coupled to said truth table reading means and said layout pattern producing means, for generating an indication of whether a memory cell corresponding to truth value data having the value of logic "0" exists within the outside boundary of said group of memory cells corresponding to truth value data having the value of logic "1" grouped by said truth value data grouping means, and where said truth value data grouping means responds to said indication to successively determine whether another memory cell corresponding to a previously received truth value of logic "0" is located immediately above, below, to the right, or to the left of a memory cell corresponding to said received truth value to form an inside group of adjacent memory cells corresponding to received truth values of logic "0"

inside-selection coordinate value data extracting means for, for extracting circumferential coordinate data locating an outside boundary on said layout pattern of said inside group of memory cells, with said outside boundary representing the inside boundary of a light-cutting pattern on said layout pattern, and with said circumferential coordinate data used to manufacture a mask for writing ROM data corresponding to said selected truth table to a mask ROM fabricated on a large scale integrated circuit.

* * * * *